US012635524B2

(12) United States Patent
Lin

(10) Patent No.: US 12,635,524 B2
(45) Date of Patent: May 19, 2026

(54) ELECTRONIC DEVICE AND METHOD FOR MANUFACTURING THE SAME

(71) Applicant: Advanced Semiconductor Engineering, Inc., Kaohsiung (TW)

(72) Inventor: Zhi-Yuan Lin, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 775 days.

(21) Appl. No.: 17/900,814

(22) Filed: Aug. 31, 2022

(65) Prior Publication Data

US 2024/0071945 A1     Feb. 29, 2024

(51) Int. Cl.
| | |
|---|---|
| *H10W 42/20* | (2026.01) |
| *H10W 70/05* | (2026.01) |
| *H10W 74/01* | (2026.01) |
| *H10W 90/00* | (2026.01) |

(52) U.S. Cl.
CPC ......... *H10W 42/20* (2026.01); *H10W 70/093* (2026.01); *H10W 74/01* (2026.01); *H10W 90/00* (2026.01); *H10W 90/701* (2026.01); *H10W 90/724* (2026.01)

(58) Field of Classification Search
None
See application file for complete search history.

(56) References Cited

U.S. PATENT DOCUMENTS

| | | | |
|---|---|---|---|
| 8,362,597 B1 * | 1/2013 | Foster | H01L 24/97 |
| | | | 257/659 |
| 9,070,793 B2 * | 6/2015 | Liao | H01L 23/3121 |
| 10,134,686 B2 * | 11/2018 | Lee | H01L 21/565 |
| 10,999,957 B2 * | 5/2021 | Lee | H05K 1/0203 |
| 11,355,449 B2 * | 6/2022 | Lee | H01L 21/4889 |
| 11,776,861 B2 * | 10/2023 | Hwang | H01L 23/10 |
| | | | 257/678 |
| 12,341,107 B2 * | 6/2025 | Han | H01L 23/16 |
| 2017/0077039 A1 * | 3/2017 | Liao | H01L 23/552 |
| 2018/0211925 A1 * | 7/2018 | Tsai | H01L 21/563 |

* cited by examiner

*Primary Examiner* — Long Pham
(74) *Attorney, Agent, or Firm* — Foley & Lardner LLP

(57) ABSTRACT

An electronic device and a method for manufacturing the same are provided. The electronic device includes a first electronic component, a second electronic component and a conductive element. The conductive element includes a first portion and a second portion. The first portion is configured to block an electromagnetic interference between the first electronic component and the second electronic component. The second portion protrudes from the first portion and contacts a shielding layer.

8 Claims, 31 Drawing Sheets

ELECTRONIC DEVICE AND METHOD FOR MANUFACTURING THE SAME

BACKGROUND

1. Field of the Disclosure

The present disclosure relates to an electronic device and a manufacturing method, and to an electronic device including a shielding structure, and a method for manufacturing the electronic device.

2. Description of the Related Art

In the current electronic device, metal lids or wires may be used to deal with electromagnetic interference (EMI) issues. The metal lids typically have eaves that extend above the designed component. The disadvantage is that the eaves may limit the height of the designed component. The metal wires may be formed through wire bonding processes and must be vertical wires to achieve shielding effects. However, the mold flow may hit or strike the metal wires causing them to tilt or be swept away during a molding process, making it difficult for them to maintain their verticality, thereby decreasing the shielding effects.

SUMMARY

In some embodiments, an electronic device includes a first electronic component, a second electronic component and a conductive element. The conductive element includes a first portion and a second portion. The first portion is configured to block an electromagnetic interference between the first electronic component and the second electronic component. The second portion protrudes from the first portion and contacts a shielding layer.

In some embodiments, an electronic device includes at least two electronic components and a shielding structure. The at least two electronic components are disposed over a circuit pattern structure. The shielding structure is disposed between the at least two electronic components. The shielding structure comprises a supporting element, an absorbable element and a connection element. The supporting element is disposed between the at least two electronic components. The absorbable element is supported by the supporting element. The connection element is connected to the absorbable element. An elevation of a top surface of the connection element is higher than an elevation of a top surface of the absorbable element.

In some embodiments, a method for manufacturing an electronic device includes: providing a circuit pattern structure including at least two electronic components disposed thereon; and absorbing at least two regions of the shielding structure by a nozzle and disposing the shielding structure over the circuit pattern structure to separate the at least two electronic components.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
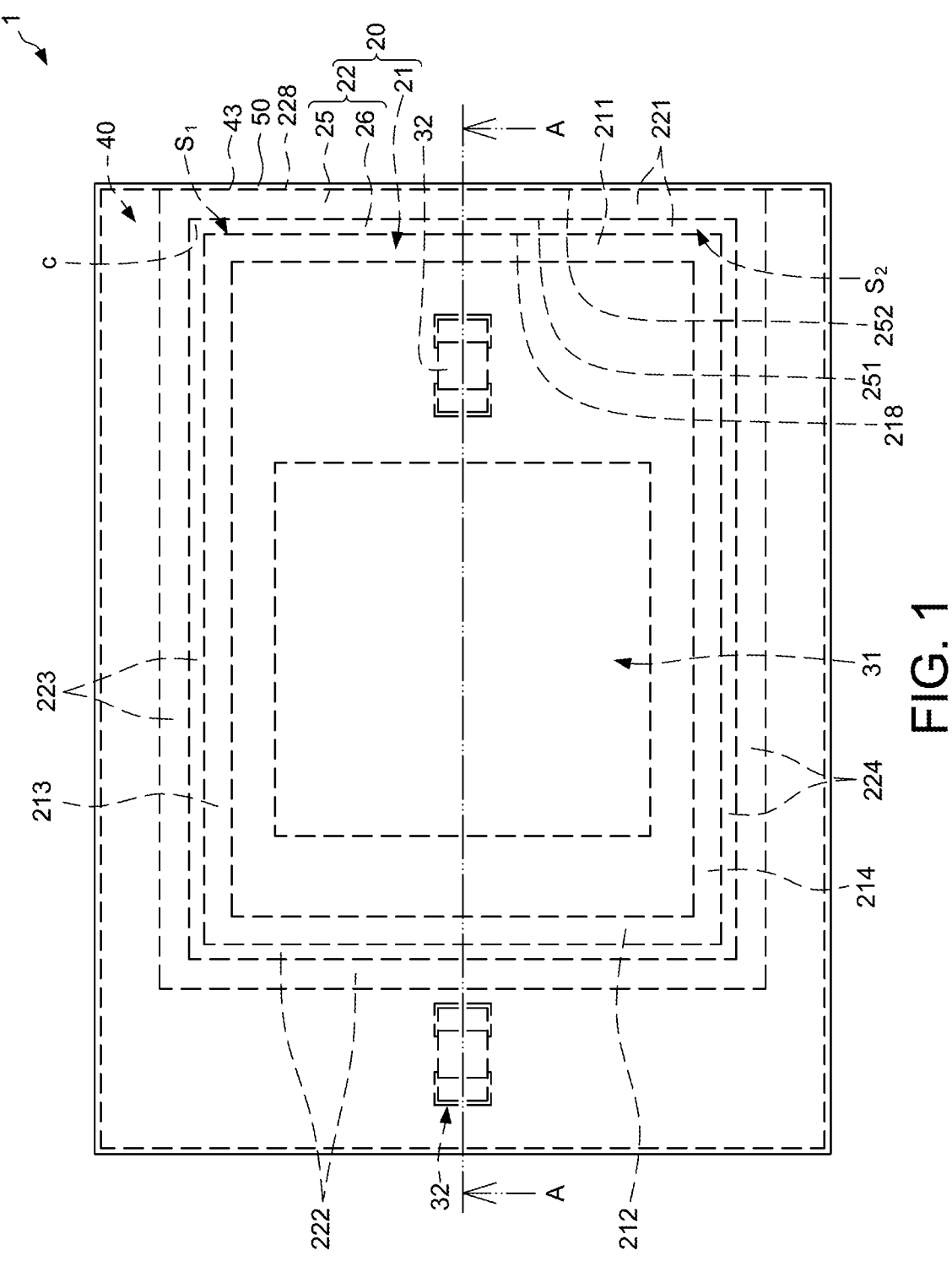
FIG. 1 illustrates a top view of an electronic device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
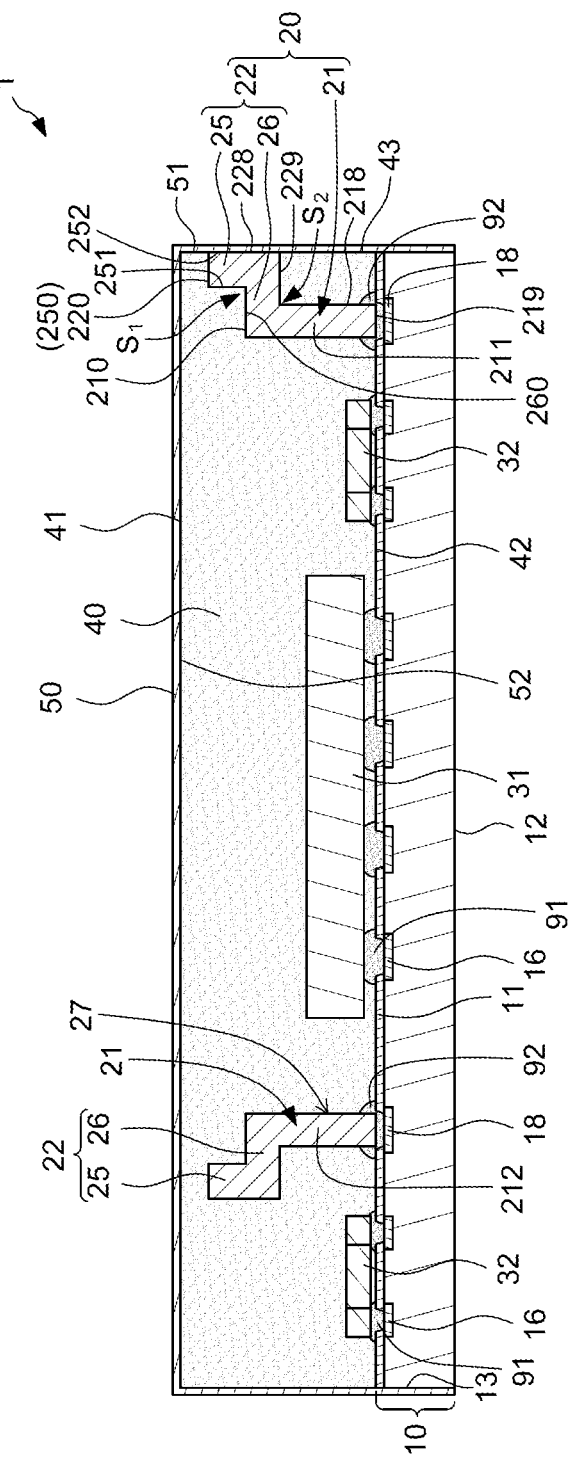
FIG. 2 illustrates a cross-sectional view along line A-A of FIG. 1.
Figure 3:
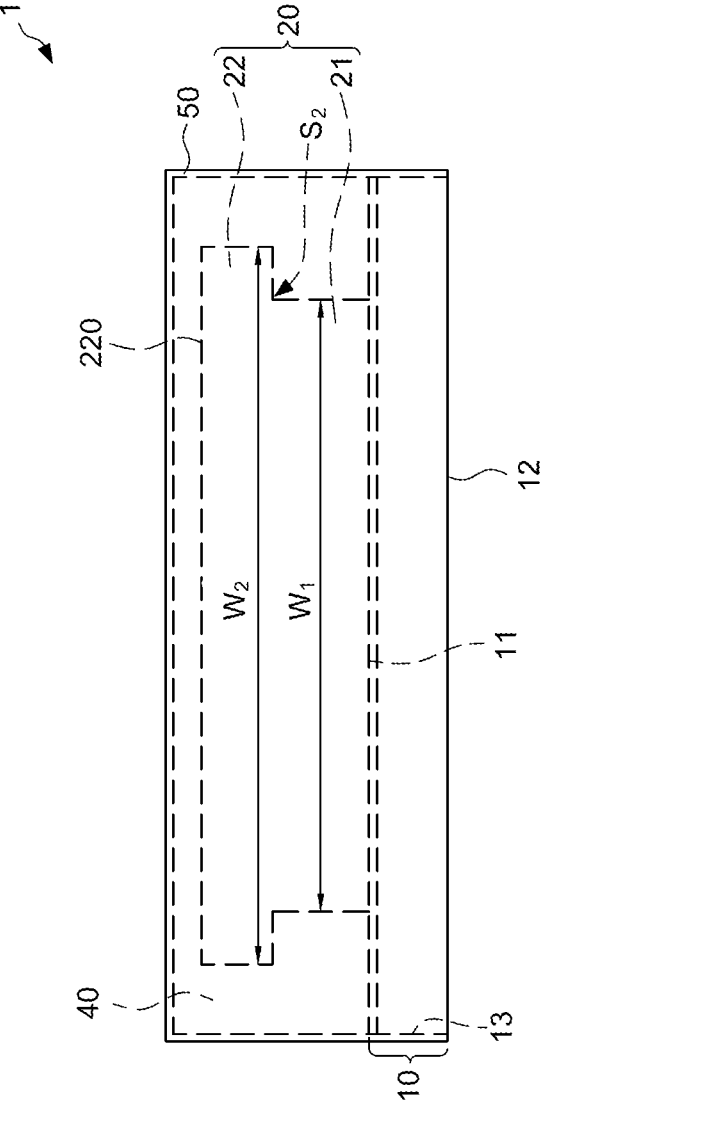
FIG. 3 illustrates a side view of FIG. 1.

FIG. 1 illustrates a top view of an electronic device 1 according to some embodiments of the present disclosure. FIG. 2 illustrates a cross-sectional view along line A-A of FIG. 1. FIG. 3 illustrates a side view of FIG. 1. The electronic device 1 includes a circuit pattern structure 10, at least two electronic components (including, for example, a first electronic component 31 and a second electronic component 32), a shielding structure 20, an encapsulant 40 and a shielding layer 50.

The circuit pattern structure 10 may be, for example, a substrate. In some embodiments, the circuit pattern structure 10 may have an upper surface 11, a lower surface 12 opposite to the upper surface 11 and a lateral surface 13 extending between the upper surface 11 and the lower surface 12. In some embodiments, the circuit pattern structure 10 may include a plurality of bonding elements (including, for example, first bonding elements 16 and second bonding elements 18) exposed from the upper surface 11. In some embodiments, the second bonding elements 18 may be ground pads. In some embodiments, the second bonding elements 18 may be ground traces.

The at least two electronic components (e.g., the first electronic component 31 and the second electronic component 32) may be, for example, active components (including, for example, semiconductor dice or semiconductor chips) or passive components (including, for example, resistors, capacitors, or inductors). The at least two electronic components (e.g., the first electronic component 31 and the second electronic component 32) may be disposed over the circuit pattern structure 10. In some embodiments, the at least two electronic components (e.g., the first electronic component 31 and the second electronic component 32) may be bonded to the first bonding elements 16 (e.g., bonding pads) through solder bumps 91.

The shielding structure 20 may be disposed over the circuit pattern structure 10 and between the at least two electronic components (e.g., the first electronic component 31 and the second electronic component 32). In some embodiments, the shielding structure 20 may also be referred to as "conductive element." In some embodiments, the shielding structure 20 (i.e., the conductive element) may be bonded to the second bonding elements 18 through solder bumps 92. In some embodiments, as shown in FIG. 2, the shielding structure 20 may include a first portion 21, and a second portion 22. In some embodiments, the first portion 21 may also be referred to as "first vertical portion" or "supporting element." The first portion 21 (i.e., the first vertical portion or the supporting element) may be disposed over the circuit pattern structure 10 and between the at least two electronic components (e.g., the first electronic component 31 and the second electronic component 32). Thus, the first portion 21 may be configured to block an electromagnetic interference (EMI) between the at least two electronic components (e.g., the first electronic component 31 and the second electronic component 32). As shown in FIG. 2, the first portion 21 has a top surface 210, a bottom surface 219 opposite to the top surface 210 and a lateral surface (or a lateral side) 218 extending between the top surface 210 and the bottom surface 219. The bottom surface 219 may face the second bonding elements 18 and be embedded in the solder bumps 92. In some embodiments, as shown in FIG. 1, the first portion 21 may be a frame structure. That is, the first portion 21 may include a first segment 211, a second segment 212 opposite to the first segment 211, a third segment 213 connecting the first segment 211 and the second segment 212, and a fourth segment 214 opposite to the third segment 213. In some embodiments, a length of the second bonding element 18 (i.e., the ground trace) may be substantially equal to a length of the second segment 212 in the top view. In some embodiments, the first portion 21 (including, for example, the first segment 211, the second segment 212, the third segment 213 and the fourth segment 214) may be disposed around the second electronic component 32 to block the EMI between the first electronic component 31 and the second electronic component 32. In some embodiments, as shown in FIG. 2, the shielding structure 20 may define an opening 27 to expose the electronic component (e.g., the first electronic component 31).

As shown in FIG. 2, the second portion 22 may extend outwardly from the lateral surface (or the lateral side) 218 of the first portion 21. In some embodiments, the second portion 22 may include a connection element 25 and an absorbable element 26. In some embodiments, the connection element 25 may also be referred to as "second vertical portion." The connection element 25 (i.e., the second vertical portion) may be disposed above the first portion 21 (i.e., the first vertical portion or the supporting element). That is, the connection element 25 (i.e., the second vertical portion) may protrude from the first portion 21 (e.g., the top surface 210). In some embodiments, as shown in FIG. 2, the connection element 25 (i.e., the second vertical portion) may not overlap with the first portion 21 (i.e., the first vertical portion or the supporting element). The absorbable element 26 may be between the first portion 21 (i.e., the first vertical portion or the supporting element) and the connection element 25 (i.e., the second vertical portion) and connect the first portion 21 (i.e., the first vertical portion or the supporting element) and the connection element 25 (i.e., the second vertical portion). In some embodiments, the absorbable element 26 may be supported by the first portion 21 (i.e., the first vertical portion or the supporting element) and configured to be absorbed or sucked by a nozzle, so that the shielding structure 20 may be moved to the circuit pattern structure 10 during a pick and place process. As shown in FIG. 2, the top surface 210 of the first portion 21 (i.e., the first vertical portion or the supporting element) may be spaced apart from the connection element 25 (i.e., the second vertical portion) through the absorbable element 26. In some embodiments, the top surface 210 of the first portion 21 (i.e., the first vertical portion or the supporting element) may be substantially coplanar with a top surface 260 of the absorbable element 26. In some embodiments, the top surface 260 of the absorbable element 26 may include the top surface 210 of the first portion 21. In some embodiments, as shown in FIG. 1 and FIG. 2, the connection element 25 may have a top surface 250, a first lateral surface 251 extending between the top surface 250 of the connection element 25 and the top surface 260 of the absorbable element 26 and a second lateral surface 252 opposite to the first lateral surface 251. The first lateral surface 251 may be substantially parallel to the lateral surface (or the lateral side) 218 of the first portion 21 (i.e., the first vertical portion or the supporting element). In some embodiments, as shown in FIG. 3, a width $W_2$ of the second portion 22 may be greater than a width $W_1$ of the first portion 21 in the side view of the shielding structure 20.

In some embodiments, as shown in FIG. 2, the second portion 22 may have a top surface 220 (i.e., the top surface 250 of the connection element 25), a bottom surface 229 opposite to the top surface 220 and a lateral surface 228 (i.e., the second lateral surface 252 of the connection element 25) extending between the top surface 220 and the bottom surface 229. An elevation of the top surface 220 (i.e., the top surface 250 of the connection element 25) may be higher than an elevation of the top surface 260 of the absorbable element 26. An elevation of the bottom surface 229 may be lower than the elevation of the top surface 260 of the absorbable element 26. The lateral surface 228 may be a lateral surface of the connection element 25 (i.e., the second vertical portion).

In some embodiments, as shown in FIG. 1, the second portion 22 may be a frame structure. That is, the second portion 22 may include a first segment 221, a second segment 222 opposite to the first segment 221, a third segment 223 connecting the first segment 221 and the second segment 222, and a fourth segment 224 opposite to the third segment 223. In some embodiments, the second portion 22 (including, for example, the first segment 221, the second segment 222, the third segment 223 and the fourth segment 224) may be disposed around the first portion 21 (including, for example, the first segment 211, the second segment 212, the third segment 213 and the fourth segment 214).

In some embodiments, as shown in FIG. 2, the first portion 21 (i.e., the first vertical portion or the supporting element) and the second portion 22 (including, for example, the connection element 25 (i.e., the second vertical portion) and the absorbable element 26) may collectively define a first step $S_1$ and a second step $S_2$ in the cross-sectional view of the shielding structure 20. The first step $S_1$ may face the shielding layer 50 and overlap the second step $S_2$. The first step $S_1$ may face upward, and the second step $S_2$ may face downward. In some embodiments, the first step $S_1$ may be defined by the connection element 25 and the absorbable element 26. The second step $S_2$ may be defined by the absorbable element 26 and the first portion 21. In some embodiments, as shown in FIG. 1, the first step $S_1$ and the second step $S_2$ may extend along one side of the electronic device 1 from the top view of the electronic device 1. In addition, the first step $S_1$ may define at least one corner C from the top view.

As shown in FIG. 2, the encapsulant 40 may be disposed on the circuit pattern structure 10 to encapsulate the at least two electronic components (including, for example, the first electronic component 31 and the second electronic component 32) and the shielding structure 20 (including, for example, the first portion 21 and the second portion 22). A material of the encapsulant 40 may be a molding compound with or without fillers. In some embodiments, the encapsulant 40 may have a top surface 41, a bottom surface 42 opposite to the top surface 41 and a lateral surface 43 extending between the top surface 41 and the bottom surface 42. In some embodiments, as shown in FIG. 2, the lateral surface 43 of the encapsulant 40 may expose a portion of the shielding structure 20 (e.g., the connection element 25 (i.e., the second vertical portion) and the lateral surface 228 of the second portion 22). In some embodiments, the lateral surface 228 of the second portion 22 may be aligned with the lateral surface 43 of the encapsulant 40. The first portion 21 (i.e., the first vertical portion or the supporting element) and the absorbable element 26 may be spaced apart from the lateral surface 43 of the encapsulant 40. The top surface 220 (i.e., the top surface 250 of the connection element 25) of the second portion 22 may be spaced apart from the top surface 41 of the encapsulant 40.

The shielding layer 50 may encapsulate the lateral surface 228 (i.e., the second lateral surface 252 of the connection element 25) of the second portion 22 (i.e., the lateral surface of the connection element 25 (i.e., the second vertical portion)) of the shielding structure 20, the top surface 41 of the encapsulant 40, the lateral surface 43 of the encapsulant 40 and the lateral surface 13 of the circuit pattern structure 10. That is, the lateral surface 228 (i.e., the second lateral surface 252 of the connection element 25) of the second portion 22 (i.e., the lateral surface of the connection element 25 (i.e., the second vertical portion)), the top surface 41 of the encapsulant 40 and the lateral surface 43 of the encapsulant 40 may contact or be connected to or be covered by an inner lateral side 51 of the shielding layer 50. In some embodiments, the first portion 21 (i.e., the first vertical portion or the supporting element) and the absorbable element 26 may be spaced apart from the inner lateral side 51 of the shielding layer 50. The top surface 220 (i.e., the top surface 250 of the connection element 25) of the second portion 22 may be spaced apart from an inner bottom side 52 of the shielding layer 50. In some embodiments, a material of the shielding layer 50 may be, for example, metal (e.g. copper). In some embodiments, the shielding layer 50 may include three metal layers (including, for example, a first stainless steel layer, a copper layer and a second stainless steel layer). The three metal layers (e.g., the first stainless steel layer, the copper layer and the second stainless steel layer) may be stacked on one another.

In the embodiment illustrated in FIG. 1 to FIG. 3, the second portion 22 (including, for example, the connection element 25 (i.e., the second vertical portion) and the absorbable element 26) of the shielding structure 20 does not extend above the electronic components (e.g., the first electronic component 31 and the second electronic component 32). Thus, the height of the electronic components (e.g., the first electronic component 31 and the second electronic component 32) may not be limited by the second portion 22 of the shielding structure 20. In addition, the first portion 21 (i.e., the first vertical portion or the supporting element) of the shielding structure 20 may withstand thrust or hit from the mold flow without shifting or tilting during a molding process, thereby maintaining its verticality and increasing shielding effects. The mold flow may form the encapsulant 40 after a curing process. Thus, the shielding layer 50 may be connected to the shielding structure 20 securely.

Figure 4:
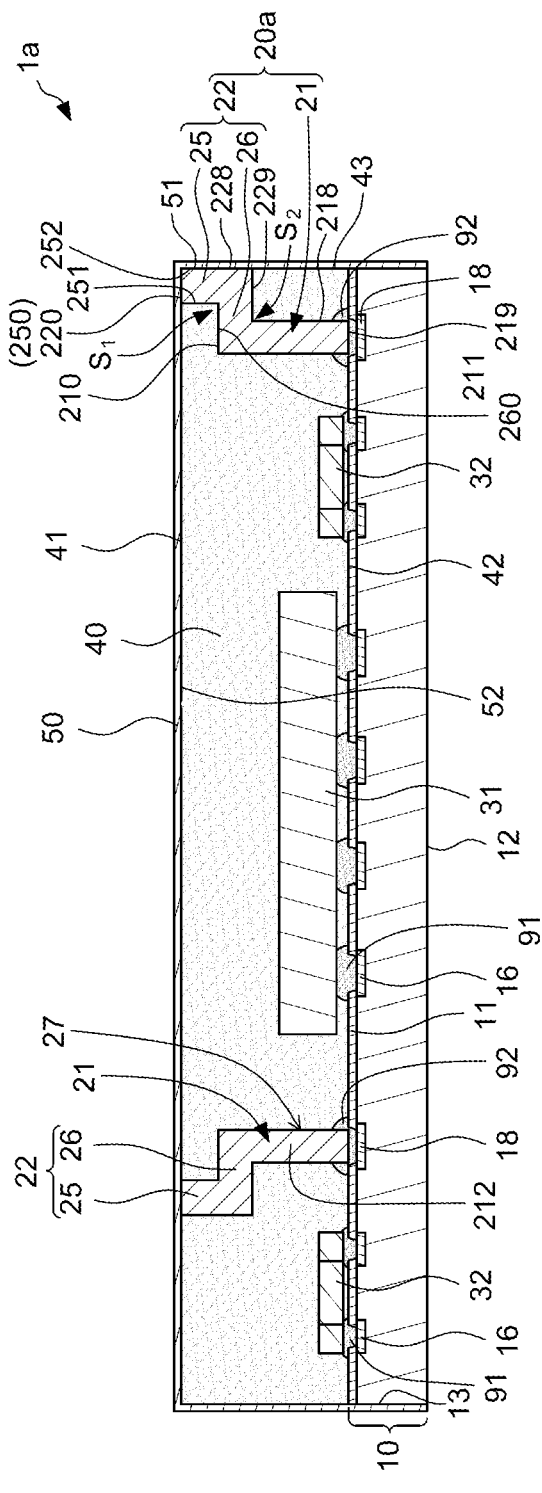
FIG. 4 illustrates a cross-sectional view of an electronic device according to some embodiments of the present disclosure.

FIG. 4 illustrates a cross-sectional view of an electronic device 1a according to some embodiments of the present disclosure. The electronic device 1a of FIG. 4 is similar to the electronic device 1 of FIG. 2, except for a configuration of the shielding structure 20a. In some embodiments, as shown in FIG. 4, the top surface 220 (i.e., the top surface 250 of the connection element 25) of the second portion 22 of the shielding structure 20a may contact or be connected to the inner bottom side 52 of the shielding layer 50. That is, the top surface 220 (i.e., the top surface 250 of the connection element 25) of the second portion 22 may be exposed from the top surface 41 of the encapsulant 40. In some embodiments, the top surface 220 (i.e., the top surface 250 of the connection element 25) of the second portion 22 may be aligned with the top surface 41 of the encapsulant 40. In some embodiments, the shielding layer 50 may be spaced apart from the absorbable element 26 and the first portion 21 (i.e., the first vertical portion or the supporting element).

Figure 5:
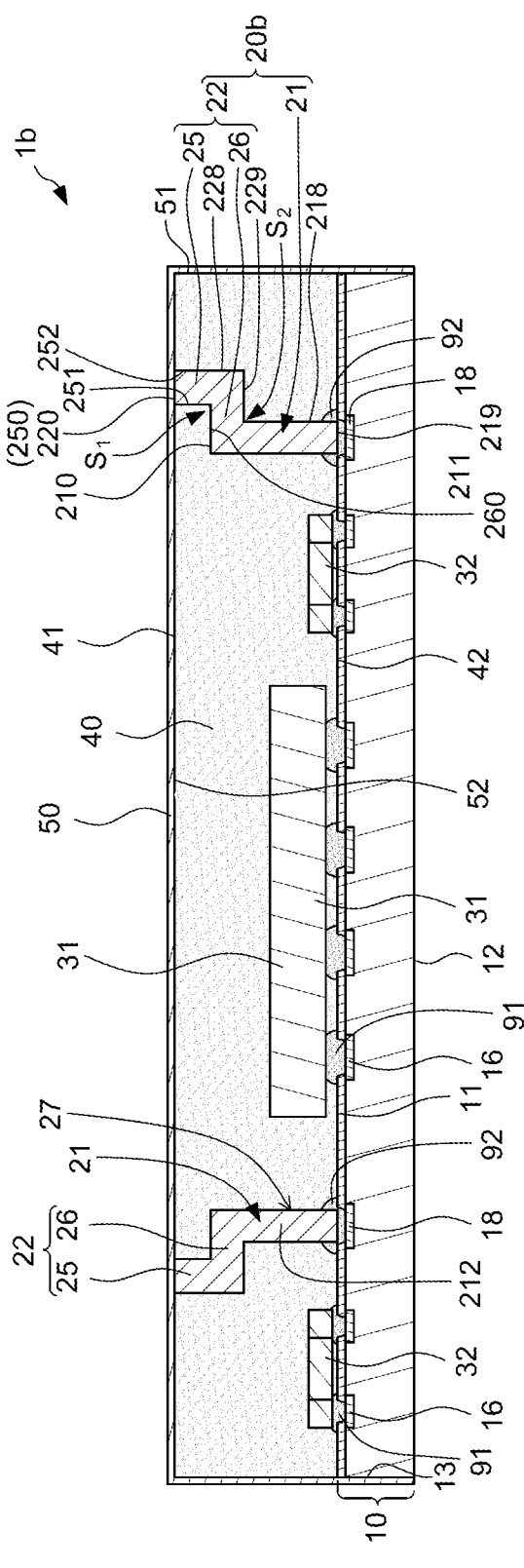
FIG. 5 illustrates a cross-sectional view of an electronic device according to some embodiments of the present disclosure.

FIG. 5 illustrates a cross-sectional view of an electronic device 1b according to some embodiments of the present disclosure. The electronic device 1b of FIG. 5 is similar to the electronic device 1a of FIG. 4, except for a configuration of the shielding structure 20b. In some embodiments, as shown in FIG. 5, the lateral surface 228 of the second portion 22 of the shielding structure 20b may be spaced apart from the shielding layer 50. That is, the shielding layer 50 may only contact the top surface 220 of the second portion 22. Further, the encapsulant 40 may cover and contact the lateral surface 228 of the second portion 22 of the shielding structure 20b.

Figure 6:
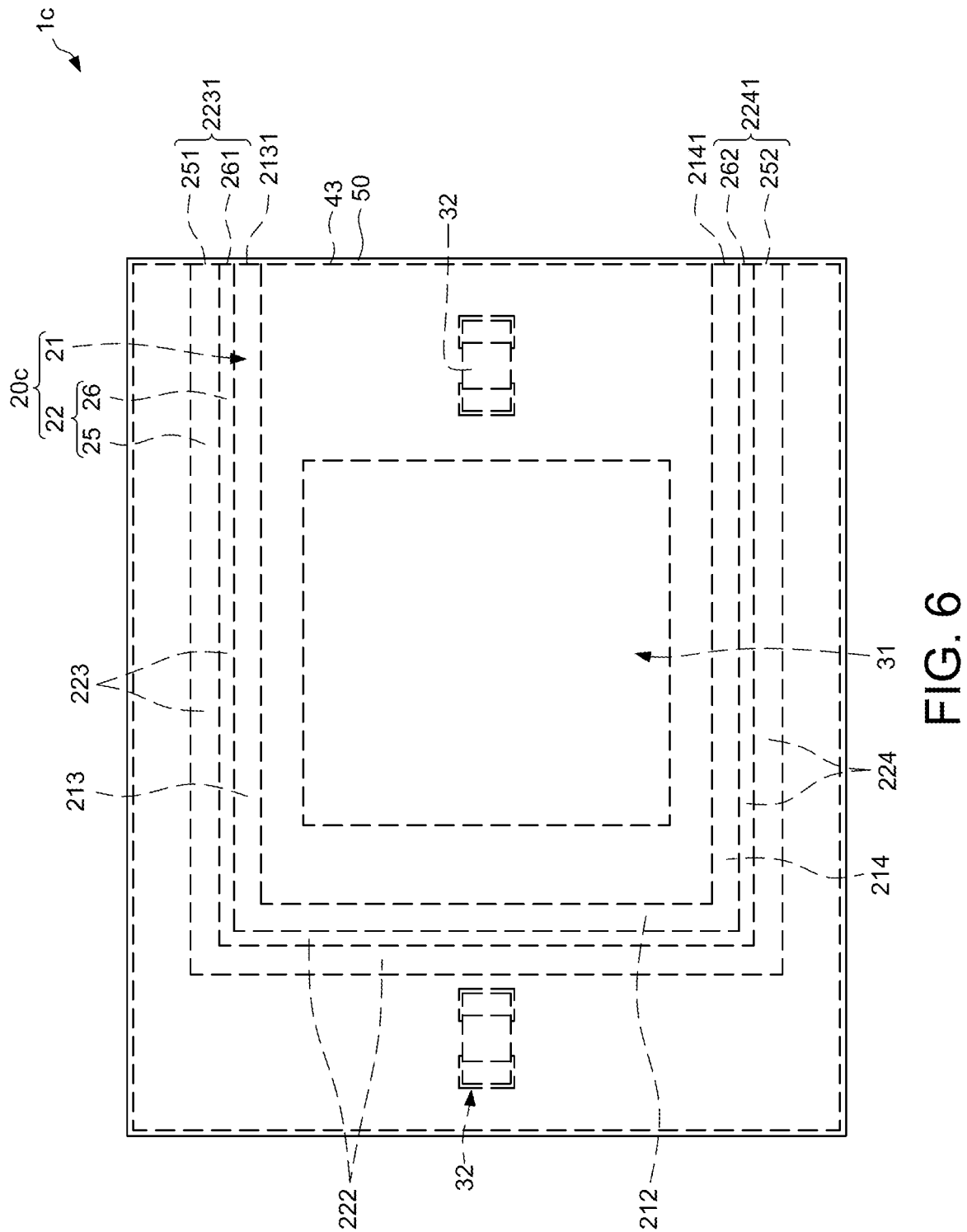
FIG. 6 illustrates a top view of an electronic device according to some embodiments of the present disclosure.
Figure 7:
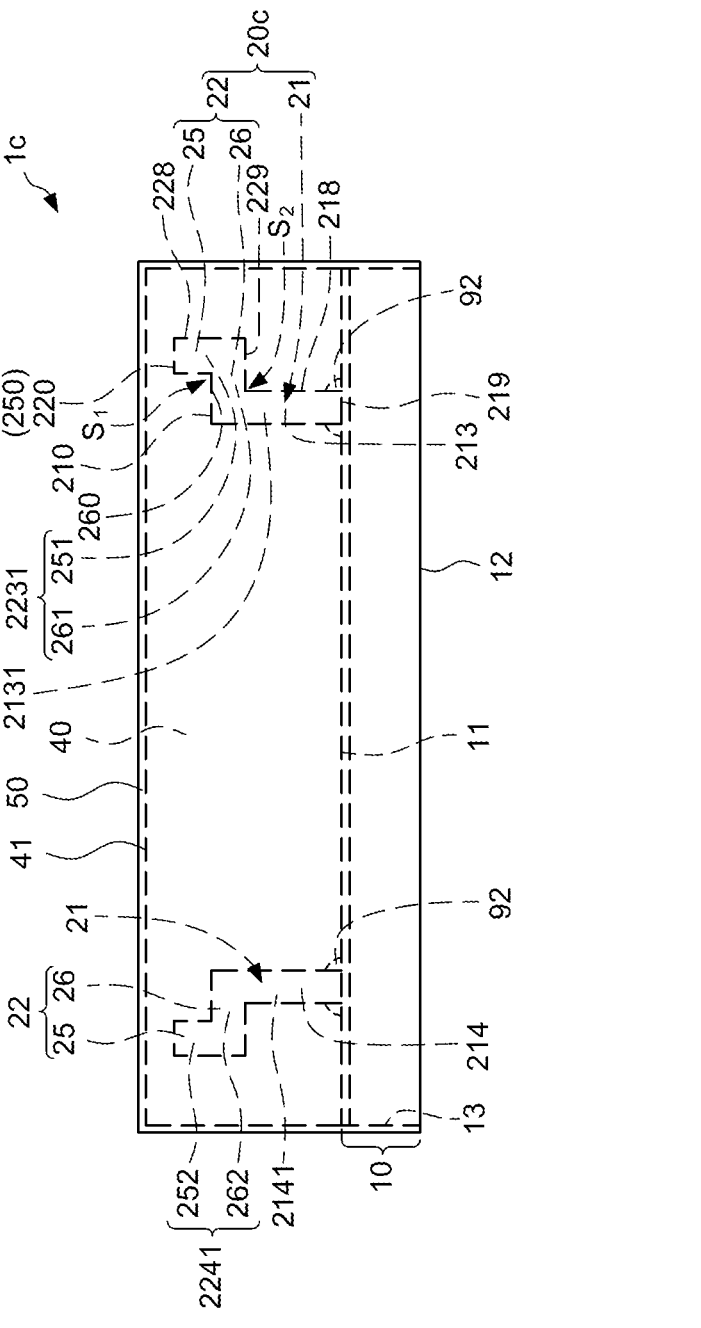
FIG. 7 illustrates a right side view of an electronic device of FIG. 6.

FIG. 6 illustrates a top view of an electronic device 1c according to some embodiments of the present disclosure. FIG. 7 illustrates a right side view of the electronic device 1c of FIG. 6. The electronic device 1c of FIG. 6 and FIG. 7 is similar to the electronic device 1 of FIG. 1 and FIG. 3, except that the first segment 211 of the first portion 21 and the first segment 221 of the second portion 22 of the shielding structure 20c are omitted. In some embodiments, as shown in FIG. 6, the first portion 21 of the shielding structure 20c may only include the second segment 212, the third segment 213 and the fourth segment 214. The second portion 22 of the shielding structure 20c may only include the second segment 222, the third segment 223 and the fourth segment 224. In some embodiments, as shown in FIG. 6 and FIG. 7, the third segment 213 of the first portion 21 (i.e., the first vertical portion or the supporting element) may include a first lateral surface 2131. The fourth segment 214 of the first portion 21 (i.e., the first vertical portion or the supporting element) may include a second lateral surface 2141. In some embodiments, the second lateral surface 2141 may be spaced apart from and substantially coplanar with the first lateral surface 2131.

The third segment 223 of the second portion 22 (including, for example, the connection element 25 (i.e., the second vertical portion) and the absorbable element 26) may include a first lateral surface 2231 (including, for example, a first lateral surface 251 of the connection element 25 (i.e., the second vertical portion) and a first lateral surface 261 of the absorbable element 26). The fourth segment 224 of the second portion 22 (including, for example, the connection element 25 (i.e., the second vertical portion) and the absorbable element 26) may include a second lateral surface 2241 (including, for example, a second lateral surface 252 of the connection element 25 (i.e., the second vertical portion) and a second lateral surface 262 of the absorbable element 26). In some embodiments, the second lateral surface 2241 may be spaced apart from and substantially coplanar with the first lateral surface 2231.

The first lateral surface 2131 of the third segment 213, the second lateral surface 2141 of the fourth segment 214 of the first portion 21, the first lateral surface 2231 of the third segment 223, the second lateral surface 2241 of the fourth segment 224 and the lateral surface 43 of the encapsulant 40 may be substantially coplanar with each other. In some embodiments, as shown in FIG. 6 and FIG. 7, the shielding layer 50 may contact the first lateral surface 2131 of the third segment 213 and the second lateral surface 2141 of the fourth segment 214 of the first portion 21 (i.e., the first vertical portion or the supporting element). In some embodiments, the shielding layer 50 may also contact the first lateral surface 2231 of the third segment 223 and the second lateral surface 2241 of the fourth segment 224 of the second portion 22 (including, for example, the connection element 25 (i.e., the second vertical portion) and the absorbable element 26).

Figure 8:
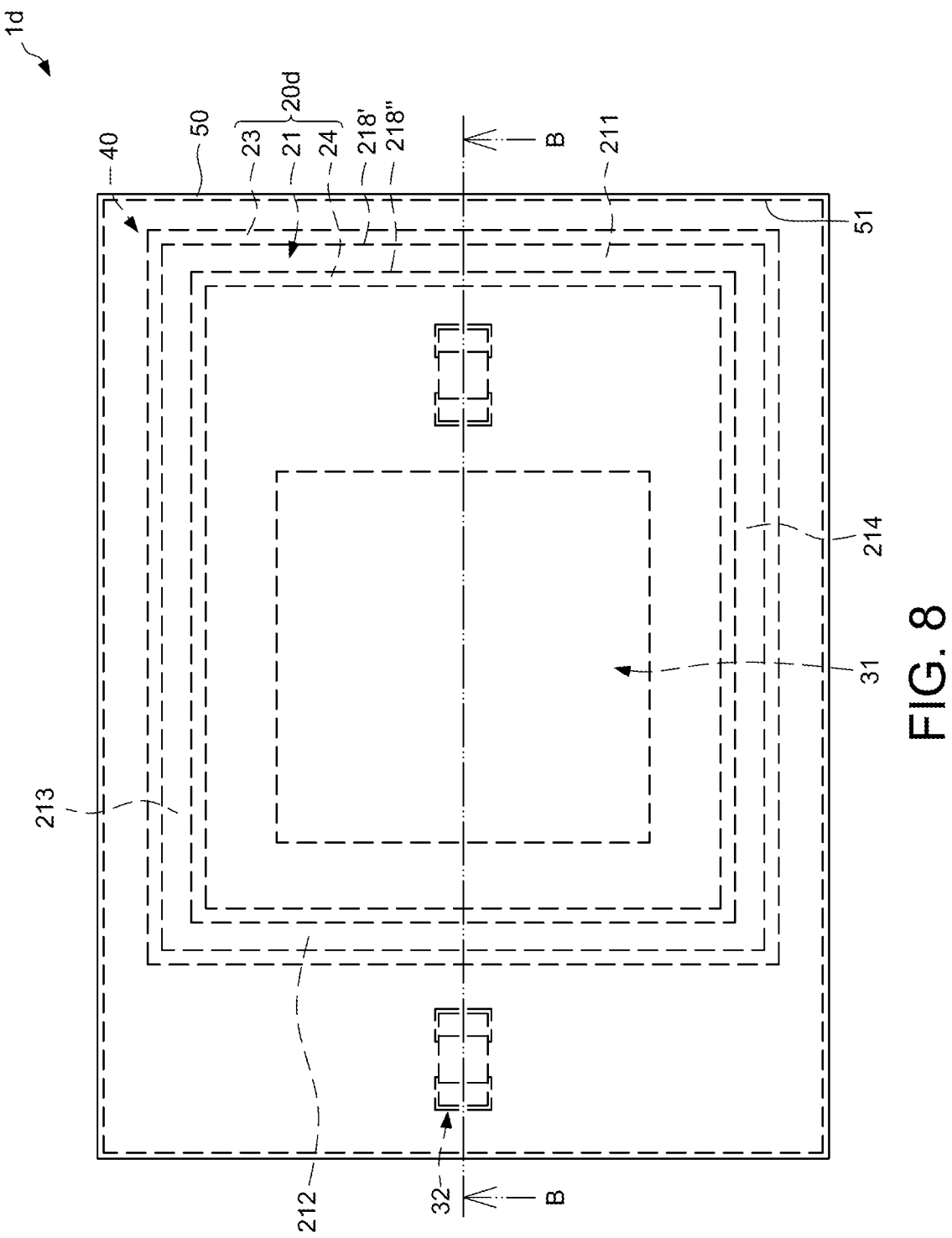
FIG. 8 illustrates a top view of an electronic device according to some embodiments of the present disclosure.
Figure 9:
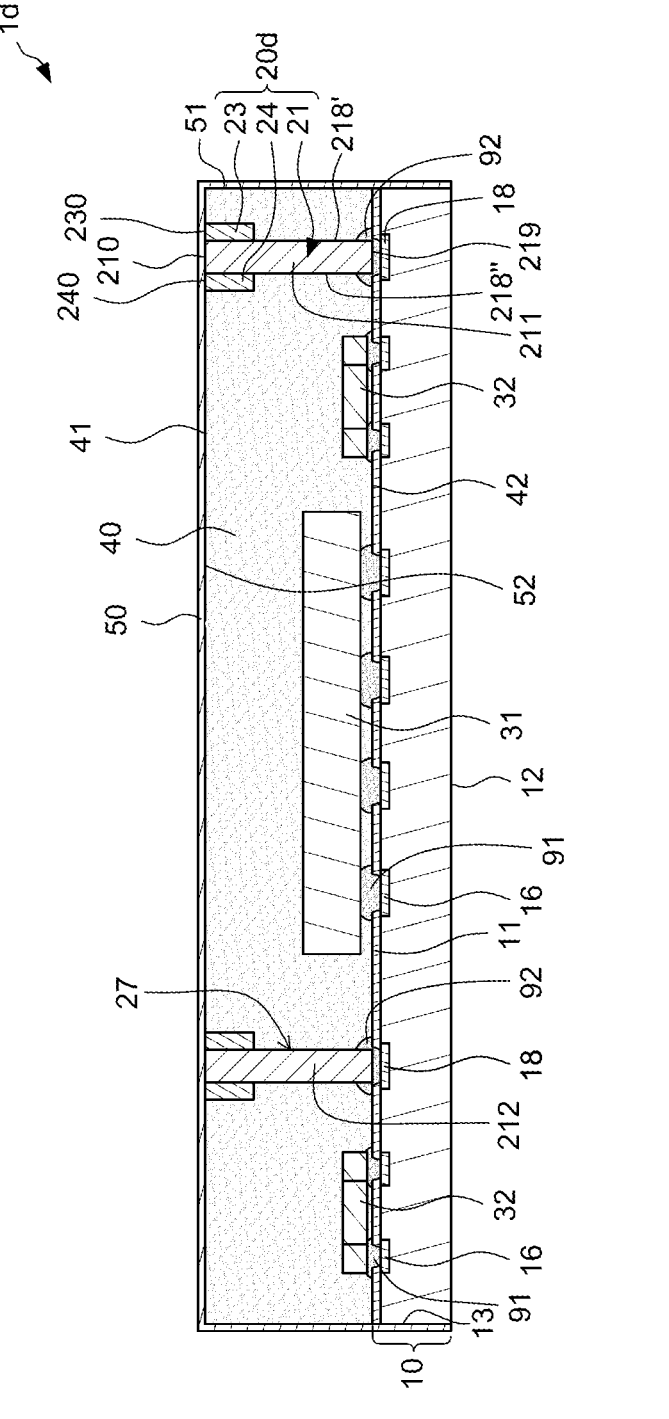
FIG. 9 illustrates a cross-sectional view along line B-B of FIG. 8.

FIG. 8 illustrates a top view of an electronic device 1d according to some embodiments of the present disclosure. FIG. 9 illustrates a cross-sectional view along line B-B of FIG. 8. The electronic device 1d of FIG. 8 and FIG. 9 is similar to the electronic device 1 of FIG. 1 and FIG. 2, except that the second portion 22 (including, for example, the connection element 25 (i.e., the second vertical portion) and the absorbable element 26) of the shielding structure 20d is omitted. In some embodiments, as shown in FIG. 8 and FIG. 9, the shielding structure 20d may further include a first absorbable portion 23 and a second absorbable portion 24. The first absorbable portion 23 may extend outwardly from a first lateral surface 218' of the first portion 21 (i.e., the first vertical portion or the supporting element). The second absorbable portion 24 may extend outwardly from a second lateral surface 218" of the first portion 21 (i.e., the first vertical portion or the supporting element). In some embodiments, the top surface 210 of the first portion 21 (i.e., the first vertical portion or the supporting element), the first absorbable portion 23 and the second absorbable portion 24 may be configured to be absorbed or sucked by a nozzle, so that the shielding structure 20 may be moved to the circuit pattern structure 10 during a pick and place process. The top surface 210 of the first portion 21 (i.e., the first vertical portion or the supporting element), a top surface 230 of the first absorbable portion 23 and a top surface 240 of the second absorbable portion 24 may contact the shielding layer 50 (e.g., the inner bottom side 52). In some embodiments, the top surface 230 of the first absorbable portion 23 and the top surface 240 of the second absorbable portion 24 may be aligned with the top surface 210 of the first portion 21 (i.e., the first vertical portion or the supporting element). In some embodiments, the top surface 210 of the first portion 21 (i.e., the first vertical portion or the supporting element), the top surface 230 of the first absorbable portion 23 and the top surface 240 of the second absorbable portion 24 may be aligned with the top surface 41 of the encapsulant 40. In some embodiments, a material of the first absorbable portion 23 and a material of the second absorbable portion 24 may be different from a material of the first portion 21 (i.e., the first vertical portion or the supporting element). In some embodiments, the material of the first absorbable portion 23 and the material of the second absorbable portion 24 may be, for example, glue or molding compound. In some embodiments, the material of the first portion 21 (i.e., the first vertical portion or the supporting element) may be, for example, metal.

Figure 10:
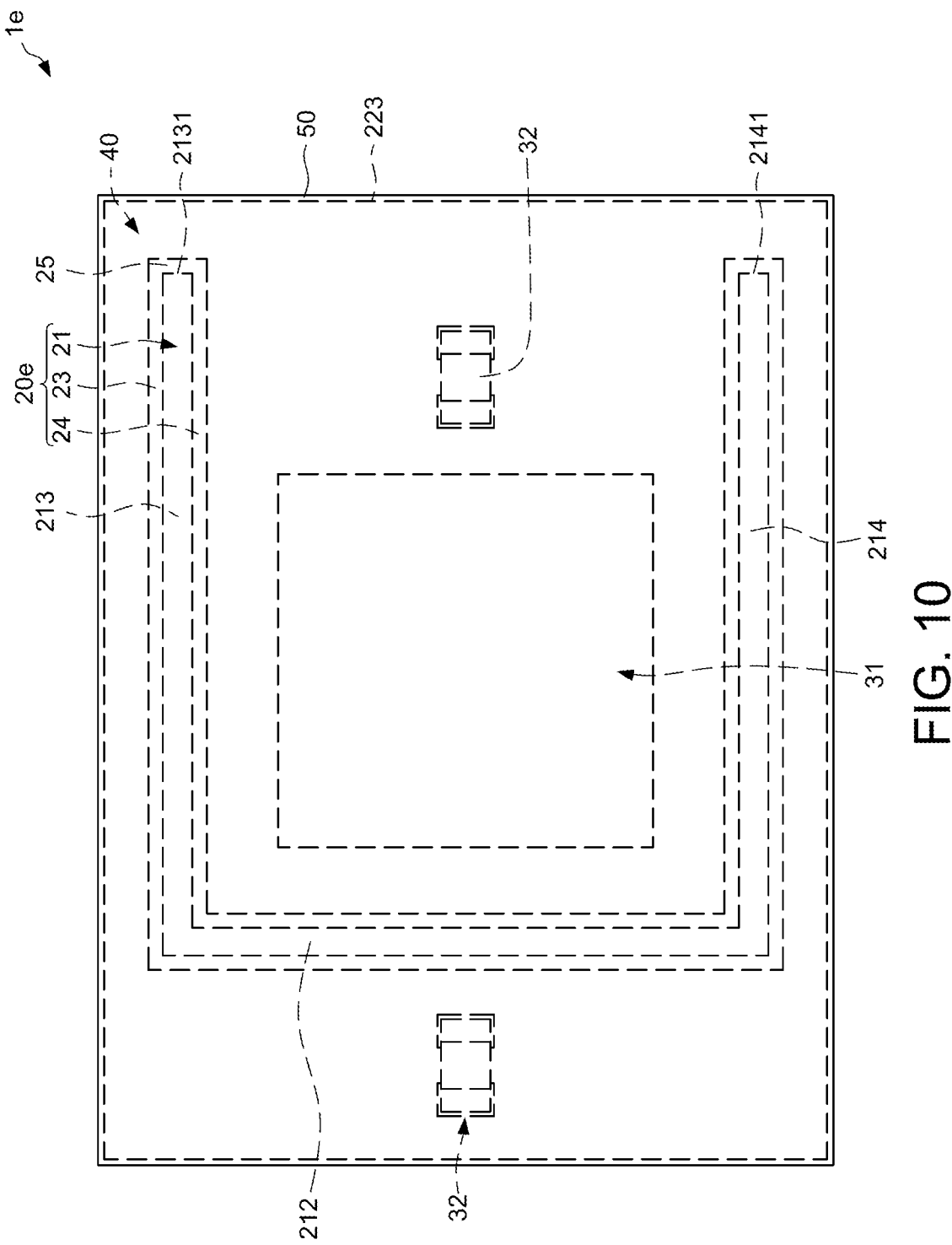
FIG. 10 illustrates a top view of an electronic device according to some embodiments of the present disclosure.

FIG. 10 illustrates a top view of an electronic device 1e according to some embodiments of the present disclosure. The electronic device 1e of FIG. 10 is similar to the electronic device 1d of FIG. 8, except that the first segment 211 of the first portion 21 (i.e., the first vertical portion or the supporting element), a portion of the first absorbable portion 23 and a portion of the second absorbable portion 24 of the shielding structure 20e are omitted. In some embodiments, as shown in FIG. 10, the first portion 21 of the shielding structure 20e may only include the second segment 212, the third segment 213 and the fourth segment 214. The third segment 213 of the first portion 21 (i.e., the first vertical portion or the supporting element) may include a first lateral surface 2131. The fourth segment 214 of the first portion 21 (i.e., the first vertical portion or the supporting element) may include a second lateral surface 2141. The second lateral surface 2141 may be spaced apart from and substantially coplanar with the first lateral surface 2131. In some embodiments, as shown in FIG. 10, the electronic device 1e may further include a third absorbable portion 25. The third absorbable portion 25 may contact the first lateral surface 2131 of the third segment 213 and the second lateral surface 2141 of the fourth segment 214. In some embodiments, the third absorbable portion 25 may be connected to the first absorbable portion 23 and the second absorbable portion 24. A material of the third absorbable portion 25 may be different from a material of the first portion 21 (i.e., the first vertical portion or the supporting element) and the same as the material of the first absorbable portion 23 and the material of the second absorbable portion 24. In some embodiments, the material of the third absorbable portion 25 may be, for example, glue or molding compound.

Figure 11:
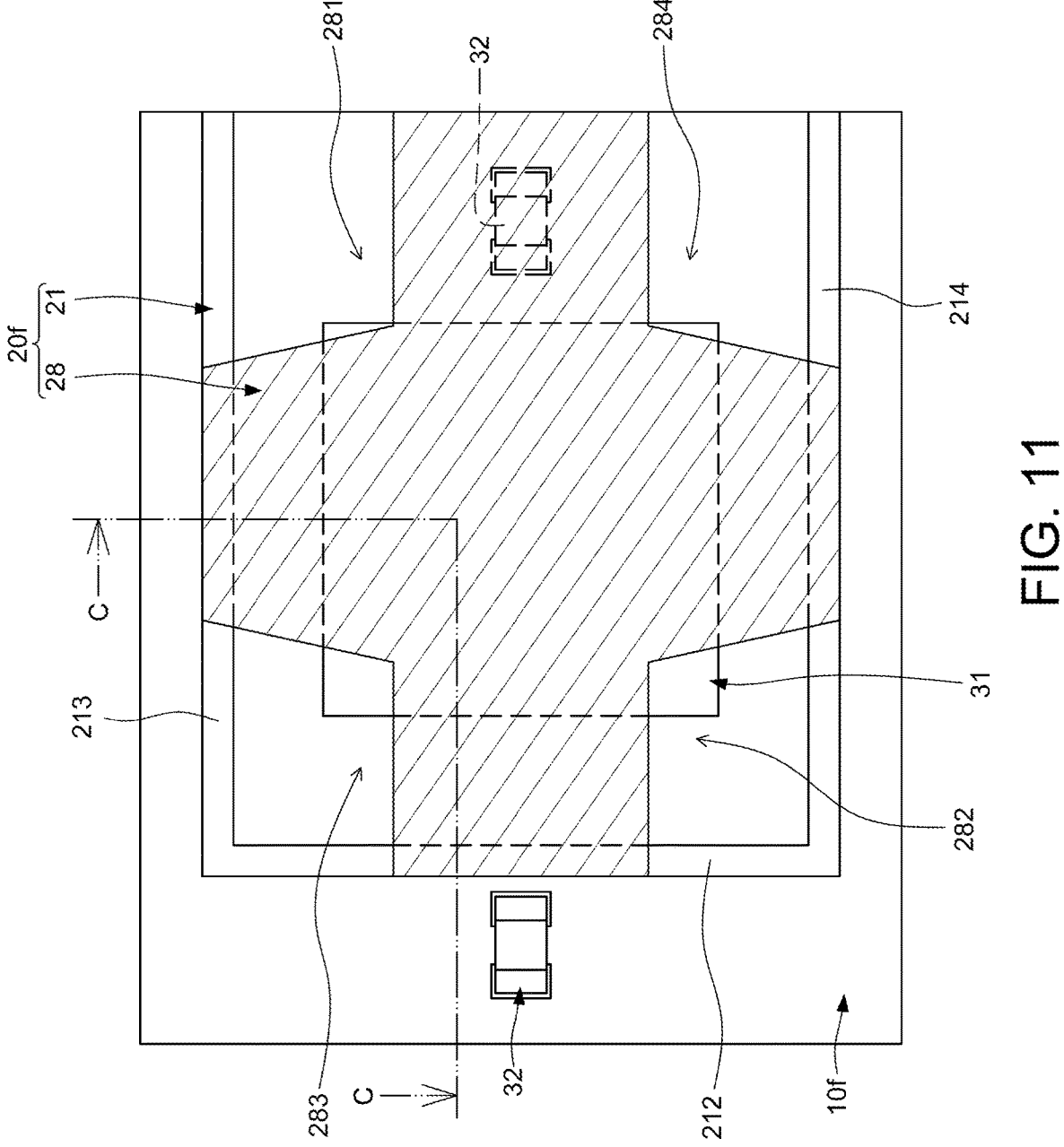
FIG. 11 illustrates a top view of an assembly of a shielding structure and a circuit pattern structure according to some embodiments of the present disclosure.
Figure 12:
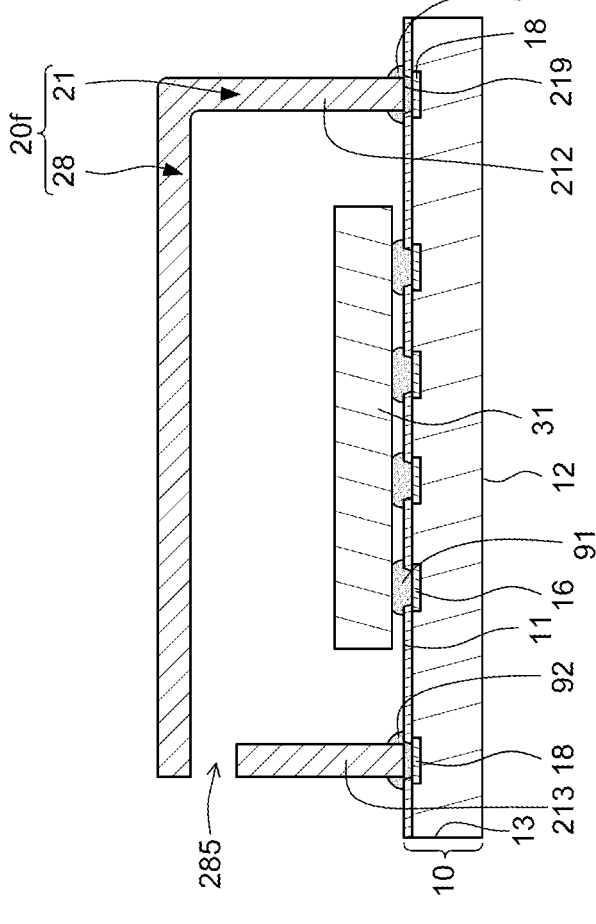
FIG. 12 illustrates a cross-sectional view along line C-C of FIG. 11.

FIG. 11 illustrates a top view of an assembly of a shielding structure 20f and a circuit pattern structure 10f according to some embodiments of the present disclosure. FIG. 12 illustrates a cross-sectional view along line C-C of FIG. 11. The circuit pattern structure 10f of FIG. 11 may be the same as the circuit pattern structure 10 of FIG. 6. The shielding structure 20f of FIG. 11 is similar to the shielding structure 20c of FIG. 6, except that the second portion 22 (including, for example, the connection element 25 (i.e., the second vertical portion) and the absorbable element 26) of the shielding structure 20f is omitted and the shielding structure 20f further includes a top cover 28. That is, the shielding structure 20f may include the first portion 21 (i.e., the first vertical portion or the supporting element) and the top cover 28. In some embodiments, as shown in FIG. 12, the top cover 28 may be connected to the first portion 21 (e.g., the second segment 212) of the shielding structure 20f. The top cover 28 of the shielding structure 20f may be absorbed or sucked by a nozzle and moved to the circuit pattern structure 10f during a pick and place process. In some embodiments, as shown in FIG. 11, the top cover 28 may include a plurality of recessions (including, for example, a first recession 281, a second recession 282, a third recession 283 and a fourth recession 284). The plurality of recessions (e.g., the first recession 281, the second recession 282, the third recession 283 and the fourth recession 284) may facilitate the mold flow passing through and entering the opening 27 of the shielding structure 20f. In some embodiments, as shown in FIG. 12, the top cover 28 and the second segment 212 may be integrally formed to a monolithic structure. The top cover 28 may extend transversely from an upper portion of the second segment 212 to a position over the third segment 213. In some embodiments, a gap 285 may be between the top cover 28 and the third segment 213. The mold flow may enter the opening 27 of the shielding structure 20f through the gap 285. In some embodiments, the top cover 28 may not extend to the position over the third segment 213 to increase the gap 285. In some embodiments, the top cover 28 may contact the third segment 213.

Figure 13:
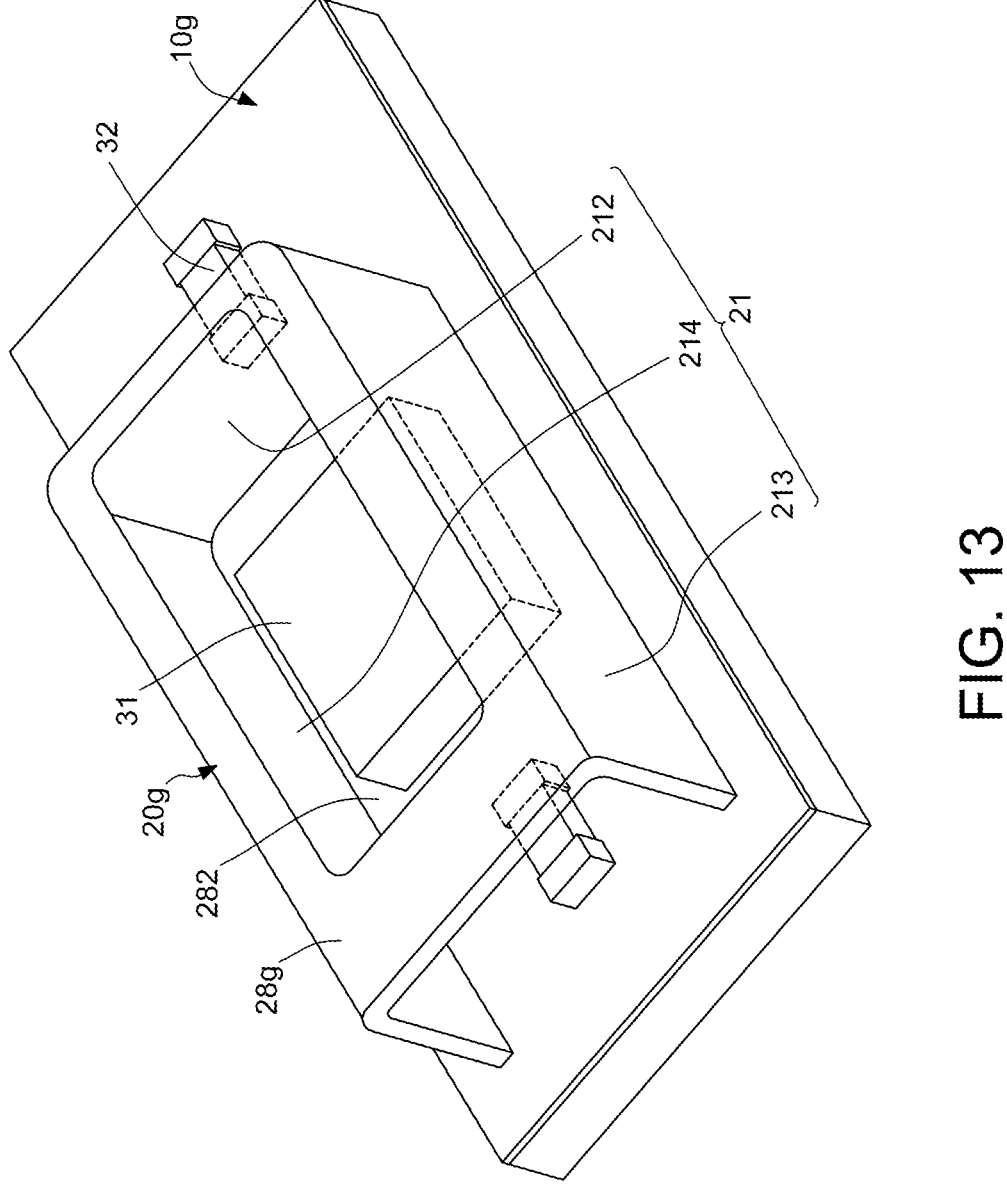
FIG. 13 illustrates a perspective view of an assembly of a shielding structure and a circuit pattern structure according to some embodiments of the present disclosure.

FIG. 13 illustrates a perspective view of an assembly of a shielding structure 20g and a circuit pattern structure 10g according to some embodiments of the present disclosure. The circuit pattern structure 10g of FIG. 13 may be the same as the circuit pattern structure 10f of FIG. 11. The shielding structure 20g of FIG. 13 is similar to the shielding structure 20f of FIG. 11, except that the second portion 22 (including, for example, the connection element 25 and the absorbable element 26) of the shielding structure 20g is omitted. In some embodiments, as shown in FIG. 13, the top cover 28g may be connected to the first portion 21 (including, for example, the second segment 212, the third segment 213 and the fourth segment 214) of the shielding structure 20g. The top cover 28g of the shielding structure 20g may be absorbed or sucked by a nozzle and moved to the circuit pattern structure 10g during a pick and place process. In some embodiments, the top cover 28g may further define an opening 282 extending through the top cover 28g. The opening 282 may be aligned with the electronic component (e.g., the first electronic component 31). Thus, the height of the electronic component (e.g., the first electronic component 31) may not be limited by the top cover 28g of the shielding structure 20g. In some embodiments, the shielding structure 20g may block the electromagnetic wave from the second electronic component 32 outside the shielding structure 20g that may interfere the first electronic component 31 inside the shielding structure 20g. In some embodiments, the shielding structure 20g may block the electromagnetic wave from the first electronic component 31 inside the shielding structure 20g that may interfere the second electronic component 32 outside the shielding structure 20g.

Figure 14:
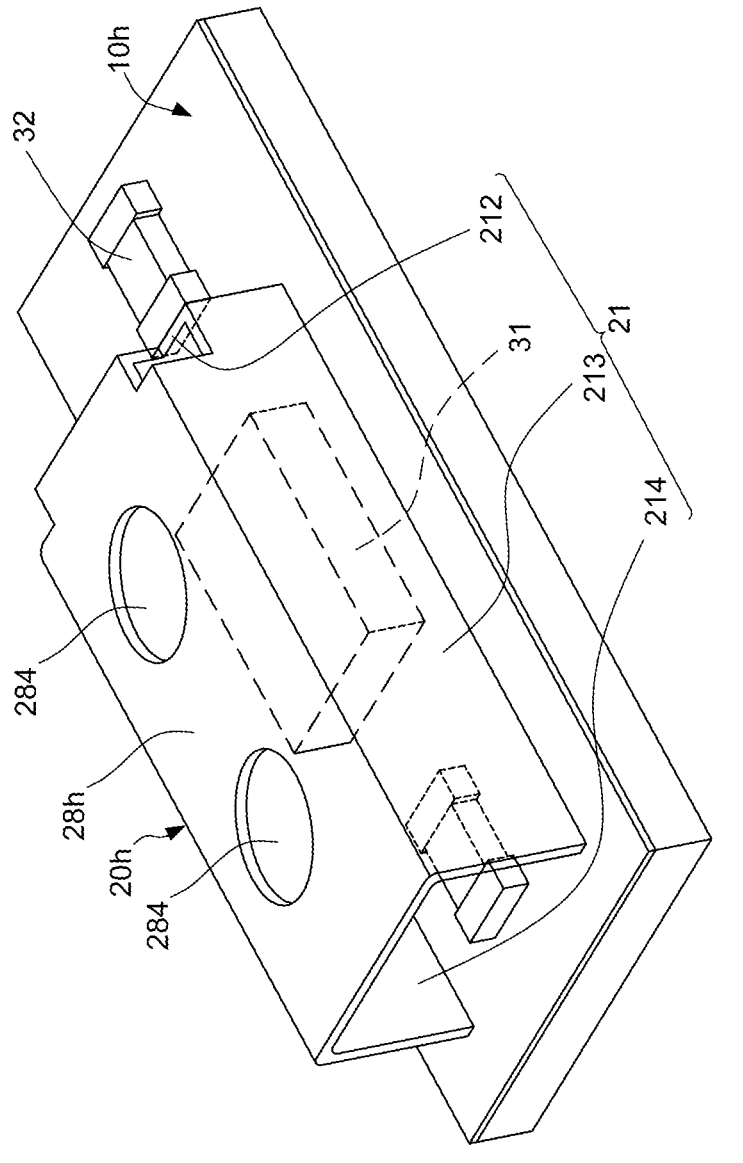
FIG. 14 illustrates a perspective view of an assembly of a shielding structure and a circuit pattern structure according to some embodiments of the present disclosure.

FIG. 14 illustrates a perspective view of an assembly of a shielding structure 20h and a circuit pattern structure 10h according to some embodiments of the present disclosure. The circuit pattern structure 10h of FIG. 14 may be the same as the circuit pattern structure 10g of FIG. 13. The shielding structure 20h of FIG. 14 is similar to the shielding structure 20g of FIG. 13, except for a structure of the top cover 28h. In some embodiments, as shown in FIG. 14, the top cover 28h may define a plurality of openings 284 extending through the top cover 28h. The openings 284 may be aligned with the electronic component (e.g., the first electronic component 31). Thus, the height of the electronic component (e.g., the first electronic component 31) may not be limited by the top cover 28h of the shielding structure 20h. In some embodiments, the top cover 28h of the shielding structure 20h may be absorbed or sucked by a nozzle and moved to the circuit pattern structure 10h during a pick and place process. In some embodiments, the shielding structure 20h may block the electromagnetic wave from the second electronic component 32 outside the shielding structure 20h that may interfere the first electronic component 31 inside the shielding structure 20*h*. In some embodiments, the shielding structure 20*h* may block the electromagnetic wave from the first electronic component 31 inside the shielding structure 20*h* that may interfere the second electronic component 32 outside the shielding structure 20*h*.

FIG. 15 through FIG. 23 illustrate a method for manufacturing an electronic device according to some embodiments of the present disclosure. In some embodiments, the method is for manufacturing an electronic device such as the electronic device 1 shown in FIG. 2.

Figure 15:
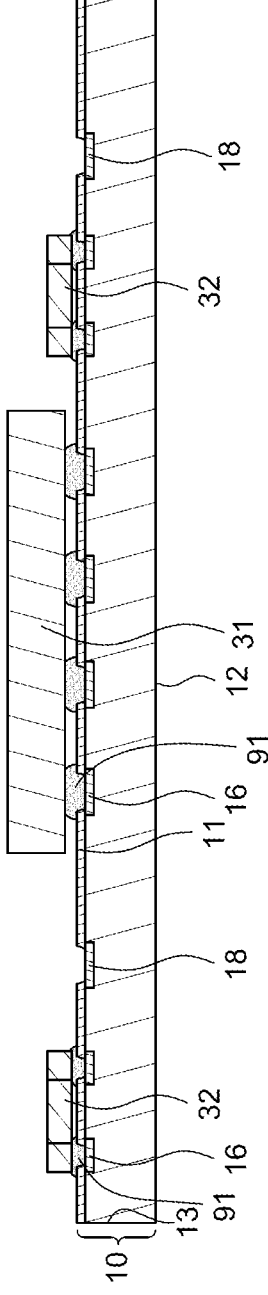
FIG. 15 illustrates one or more stages of an example of a method for manufacturing an electronic device according to some embodiments of the present disclosure.

Referring to FIG. 15, a circuit pattern structure 10 is provided. The circuit pattern structure 10 of FIG. 15 may be the same as the circuit pattern structure 10 of FIG. 2. Thus, the circuit pattern structure 10 may have an upper surface 11 and a lower surface 12 opposite to the upper surface 11 and include a plurality of bonding elements (including, for example, first bonding elements 16 and second bonding elements 18) exposed from the upper surface 11. At least two electronic components (including, for example, a first electronic component 31 and a second electronic component 32) may be disposed on the circuit pattern structure 10. The at least two electronic components (e.g., the first electronic component 31 and the second electronic component 32) may be, for example, active components (including, for example, semiconductor dice or semiconductor chips) or passive components (including, for example, resistors, capacitors, or inductors). In some embodiments, the at least two electronic components (e.g., the first electronic component 31 and the second electronic component 32) may be bonded to the first bonding elements 16 through solder bumps 91.

Figure 16:
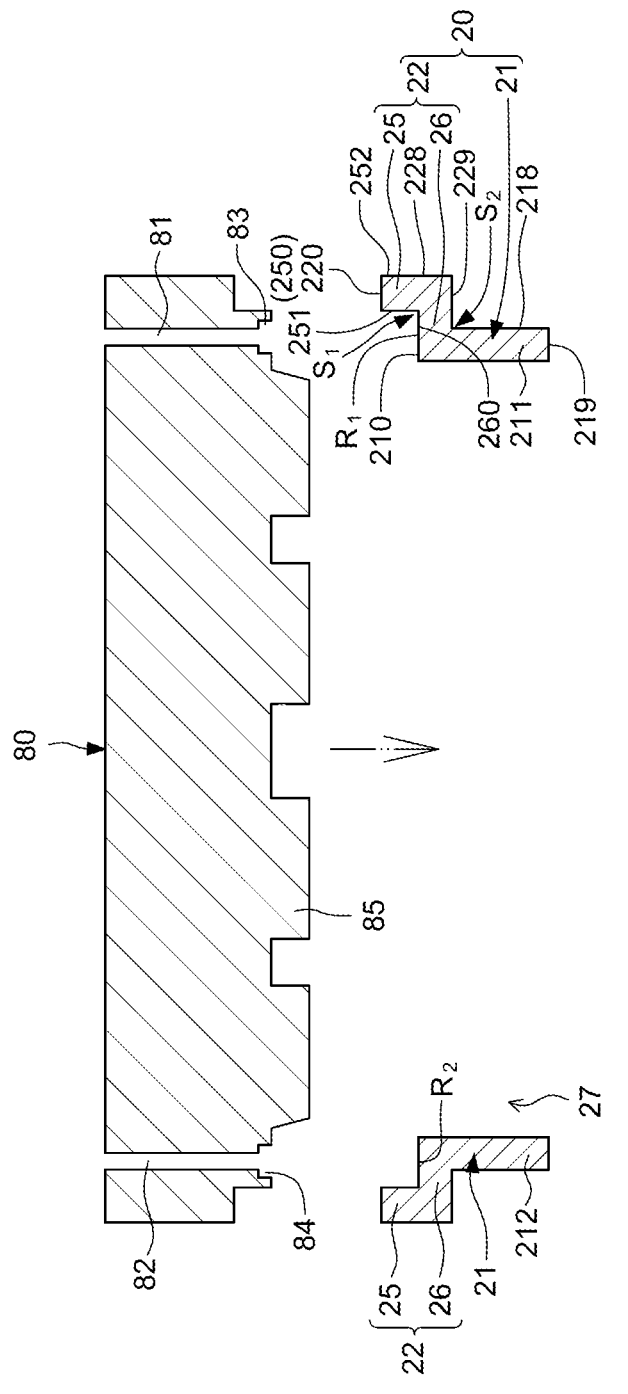
FIG. 16 illustrates one or more stages of an example of a method for manufacturing an electronic device according to some embodiments of the present disclosure.
Figure 17:
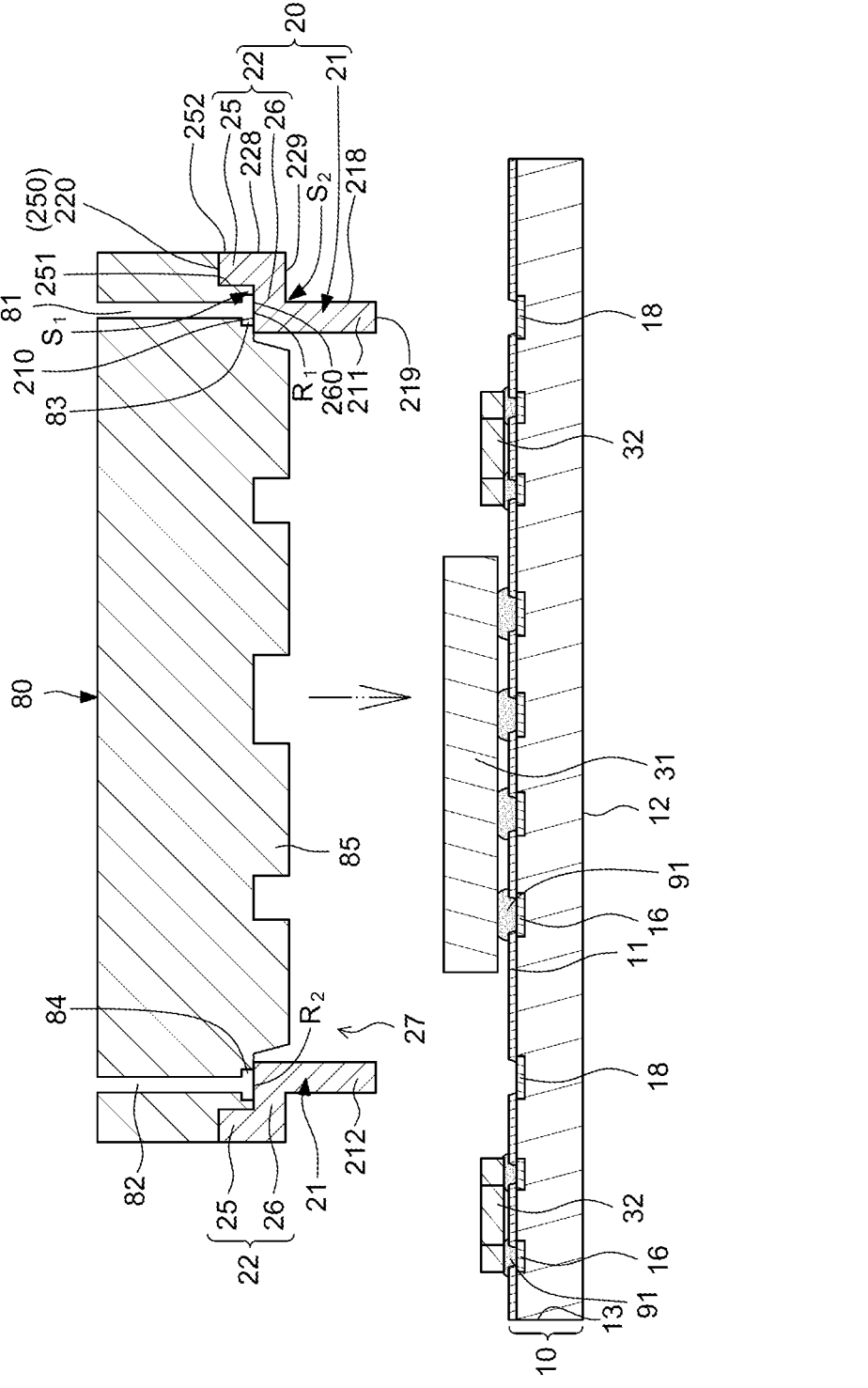
FIG. 17 illustrates one or more stages of an example of a method for manufacturing an electronic device according to some embodiments of the present disclosure.

Referring to FIG. 16 and FIG. 17, at least two regions (including, for example, a first region $R_1$ and a second region $R_2$) of a shielding structure 20 (i.e., a conductive element) are absorbed or sucked by a nozzle 80. The shielding structure 20 of FIG. 16 and FIG. 17 may be the same as the shielding structure 20 of FIG. 2. In some embodiments, the at least two regions (e.g., the first region $R_1$ and the second region $R_2$) may be two different positions of the top surface 260 of the absorbable element 26. For example, the first region $R_1$ may correspond to the first segment 211 of the first portion 21 (i.e., the first vertical portion or the supporting element). The second region $R_2$ may correspond to the second segment 212 of the first portion 21 (i.e., the first vertical portion or the supporting element). In some embodiments, as shown in FIG. 16, the nozzle 80 may include two separated vacuum holes (including, for example, a first vacuum hole 81 and a second vacuum hole 82) and two separated recessions (including, for example, a first recession 83 and a second recession 84). The two separated recessions (e.g., the first recession 83 and the second recession 84) are recessed from a bottom surface of the nozzle 80. The first vacuum hole 81 may be in communication with the first recession 83. The second vacuum hole 82 may be in communication with the second recession 84. As shown in FIG. 17, the first region $R_1$ of the shielding structure 20 may be absorbed or sucked by the first vacuum hole 81 of the nozzle 80. The second region $R_2$ of the shielding structure 20 may be absorbed or sucked by the second vacuum hole 82 of the nozzle 80. In some embodiments, a protruded portion 85 of the nozzle 80 may be aligned with the opening 27 of the shielding structure 20 between the at least two regions (e.g., the first region $R_1$ and the second region $R_2$). That is, the protruded portion 85 of the nozzle 80 may be located within the opening 27 of the shielding structure 20 after the nozzle 80 sucks the shielding structure 20. Thus, the first vacuum hole 81 and the second vacuum hole 82 may be precisely aligned with the first region $R_1$ and the second region $R_2$, respectively, so as to facilitate the absorption process or the suction process. As shown in FIG. 17, the nozzle 80 and the shielding structure 20 may move to a location above the circuit pattern structure 10.

Figure 18:
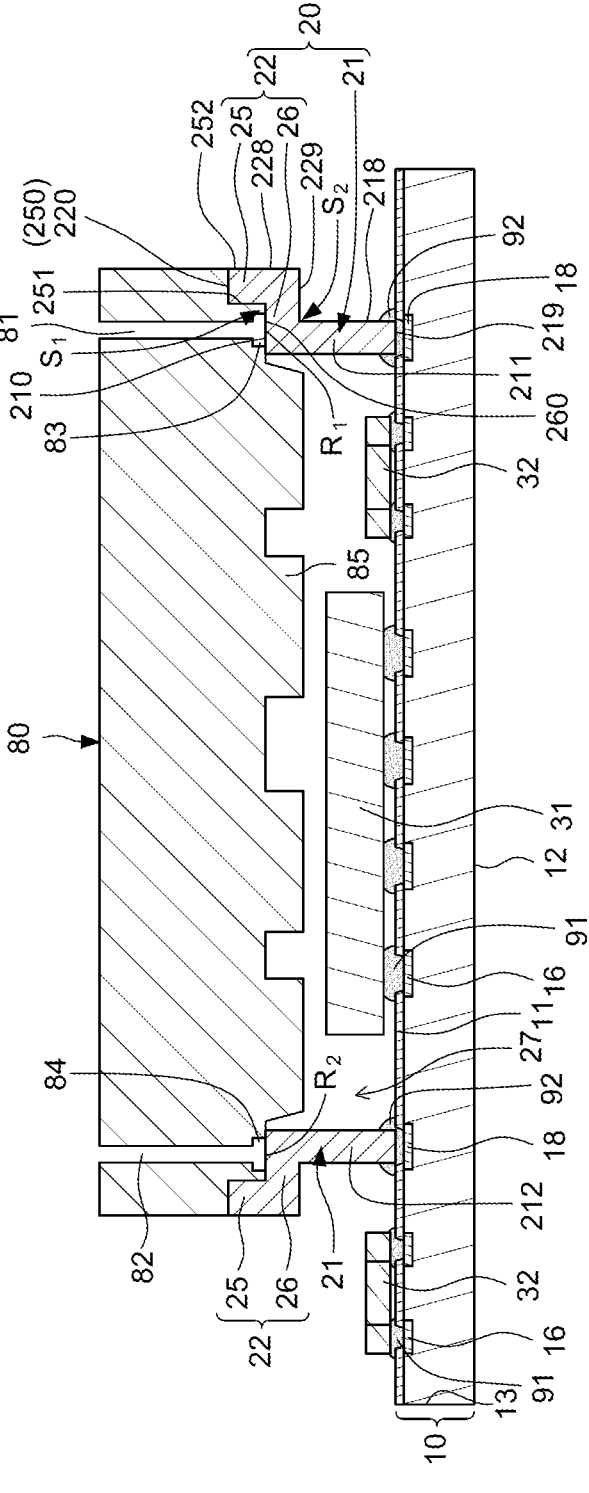
FIG. 18 illustrates one or more stages of an example of a method for manufacturing an electronic device according to some embodiments of the present disclosure.

Referring to FIG. 18, the nozzle 80 and the shielding structure 20 move toward the circuit pattern structure 10 so that the shielding structure 20 is disposed over the circuit pattern structure 10 to separate the at least two electronic components (e.g., the first electronic component 31 and the second electronic component 32). In some embodiments, the shielding structure 20 may be bonded to the second bonding elements 18 through solder bumps 92.

Figure 19:
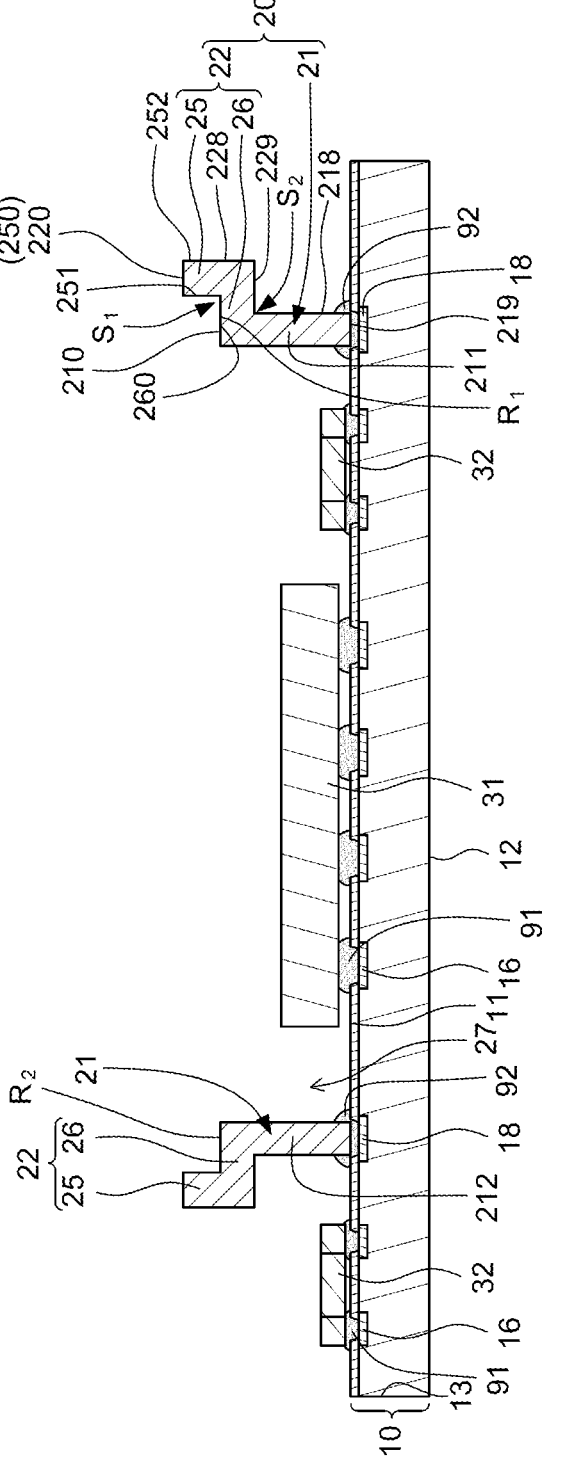
FIG. 19 illustrates one or more stages of an example of a method for manufacturing an electronic device according to some embodiments of the present disclosure.

Referring to FIG. 19, the nozzle 80 is removed.

Figure 20:
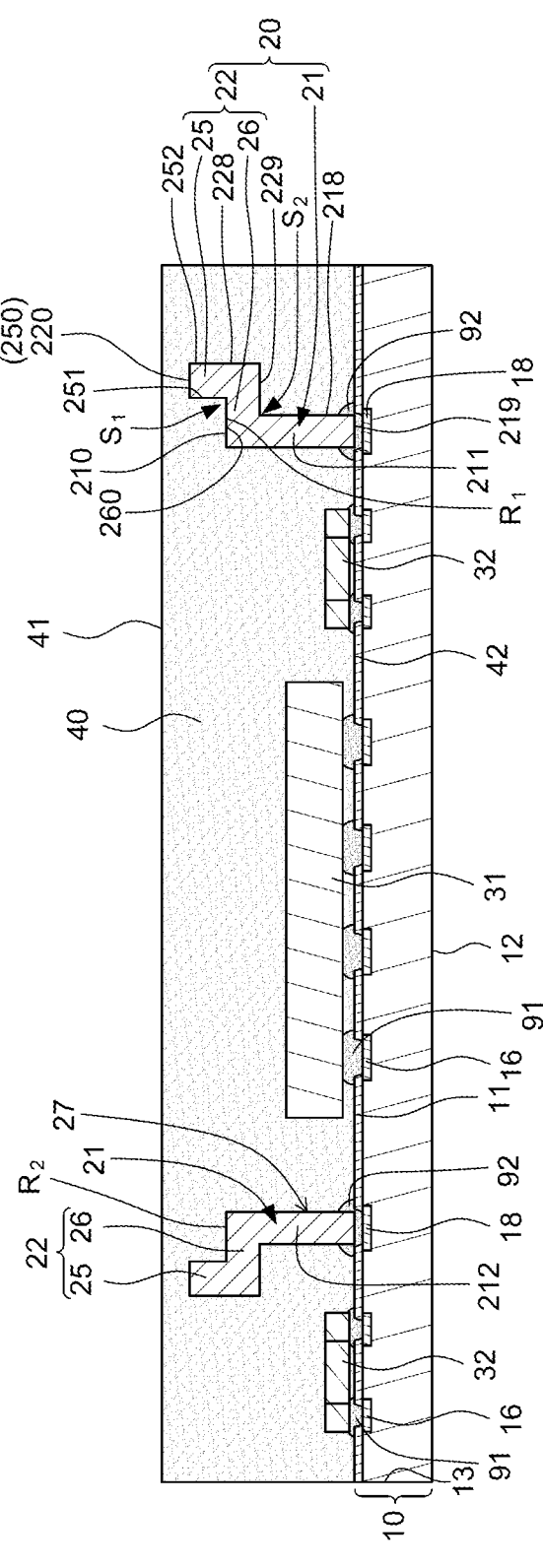
FIG. 20 illustrates one or more stages of an example of a method for manufacturing an electronic device according to some embodiments of the present disclosure.

Referring to FIG. 20, an encapsulant 40 is formed on the circuit pattern structure 10 to encapsulate the least two electronic components (including, for example, the first electronic component 31 and the second electronic component 32) and the shielding structure 20 (including, for example, the first portion 21 (i.e., the first vertical portion or the supporting element) and the second portion 22 (including, for example, the connection element 25 and the absorbable element 26)). In some embodiments, as shown in FIG. 20, the top surface 220 (i.e., the top surface 250 of the connection element 25) of the second portion 22 may be spaced apart from the top surface 41 of the encapsulant 40. The encapsulant 40 may cover and contact the top surface 220 (i.e., the top surface 250 of the connection element 25) of the second portion 22.

Figure 21:
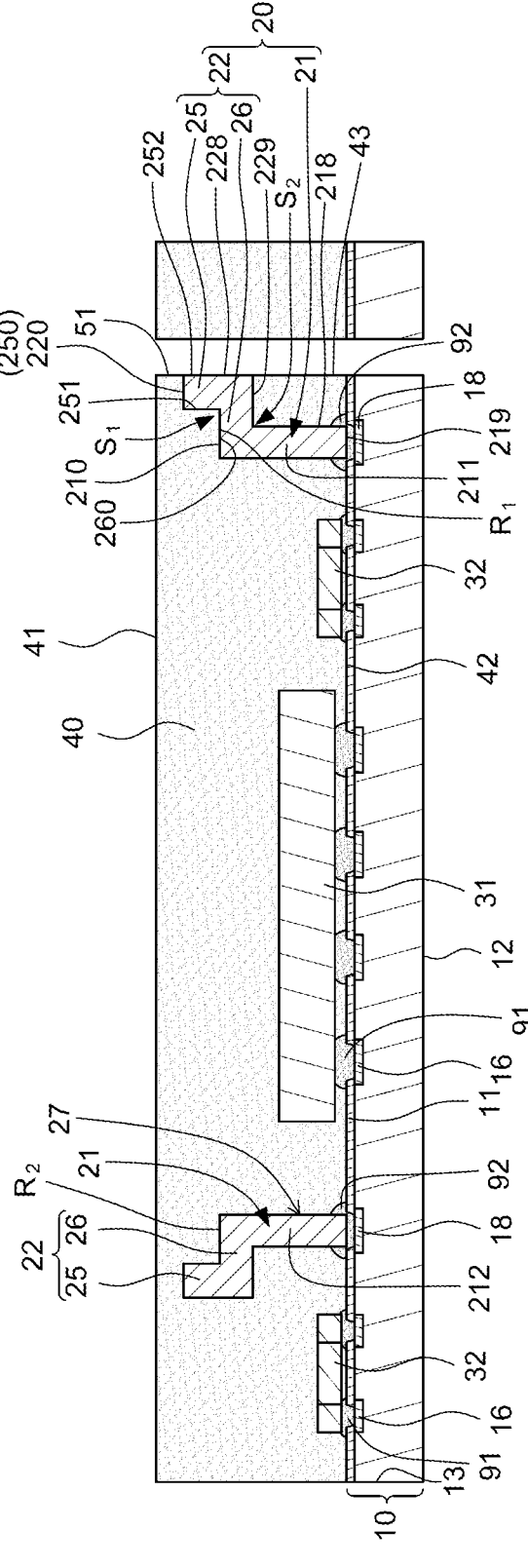
FIG. 21 illustrates one or more stages of an example of a method for manufacturing an electronic device according to some embodiments of the present disclosure.
Figure 22:
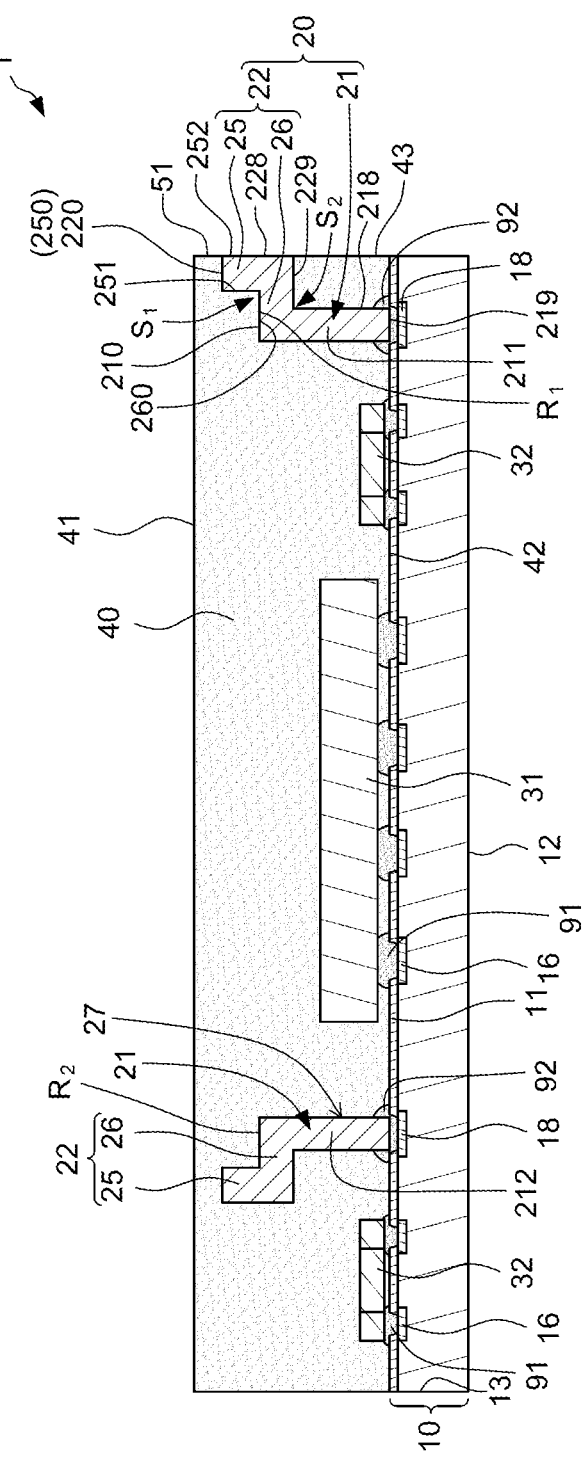
FIG. 22 illustrates one or more stages of an example of a method for manufacturing an electronic device according to some embodiments of the present disclosure.
Figure 23:
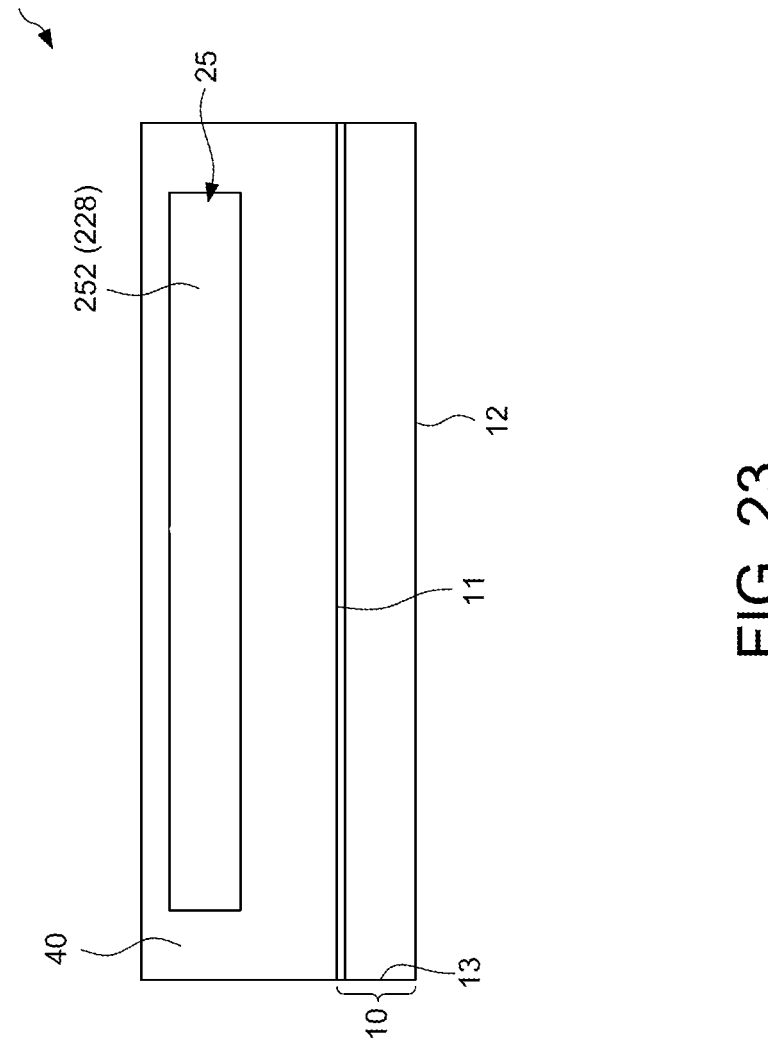
FIG. 23 illustrates one or more stages of an example of a method for manufacturing an electronic device according to some embodiments of the present disclosure.

Referring to FIG. 21 through FIG. 23, the encapsulant 40 and the circuit pattern structure 10 are sawed or singulated to expose a portion of the shielding structure 20 and to form a plurality of electronic units 1' of FIG. 22 and FIG. 23. FIG. 23 illustrates a right side view of the electronic unit 1' of FIG. 22. Meanwhile, a lateral surface 43 of the encapsulant 40 and the connection element 25 (e.g., the second lateral surface 252) of the second portion 22 are exposed. In some embodiments, the exposed portion of the shielding structure 20 may be, for example, the connection element 25 of the second portion 22. In some embodiments, the exposed portion of the shielding structure 20 (e.g., the connection element 25 of the second portion 22) may also be referred to as "third region." In some embodiments, the third region (e.g., the connection element 25 of the second portion 22) may be spaced apart from the first region $R_1$ and the second region $R_2$. In some embodiments, the lateral surface 43 of the encapsulant 40 may be aligned with a lateral surface (e.g., the second lateral surface 252) of the third region (e.g., the connection element 25 of the second portion 22).

Then, a shielding layer 50 is formed to contact the third region (e.g., the connection element 25 of the second portion 22) of the shielding structure 20 and the encapsulant 40 (including, for example, the lateral surface 43 and the top surface 41) to obtain the electronic device 1 of FIG. 2.

Figure 24:
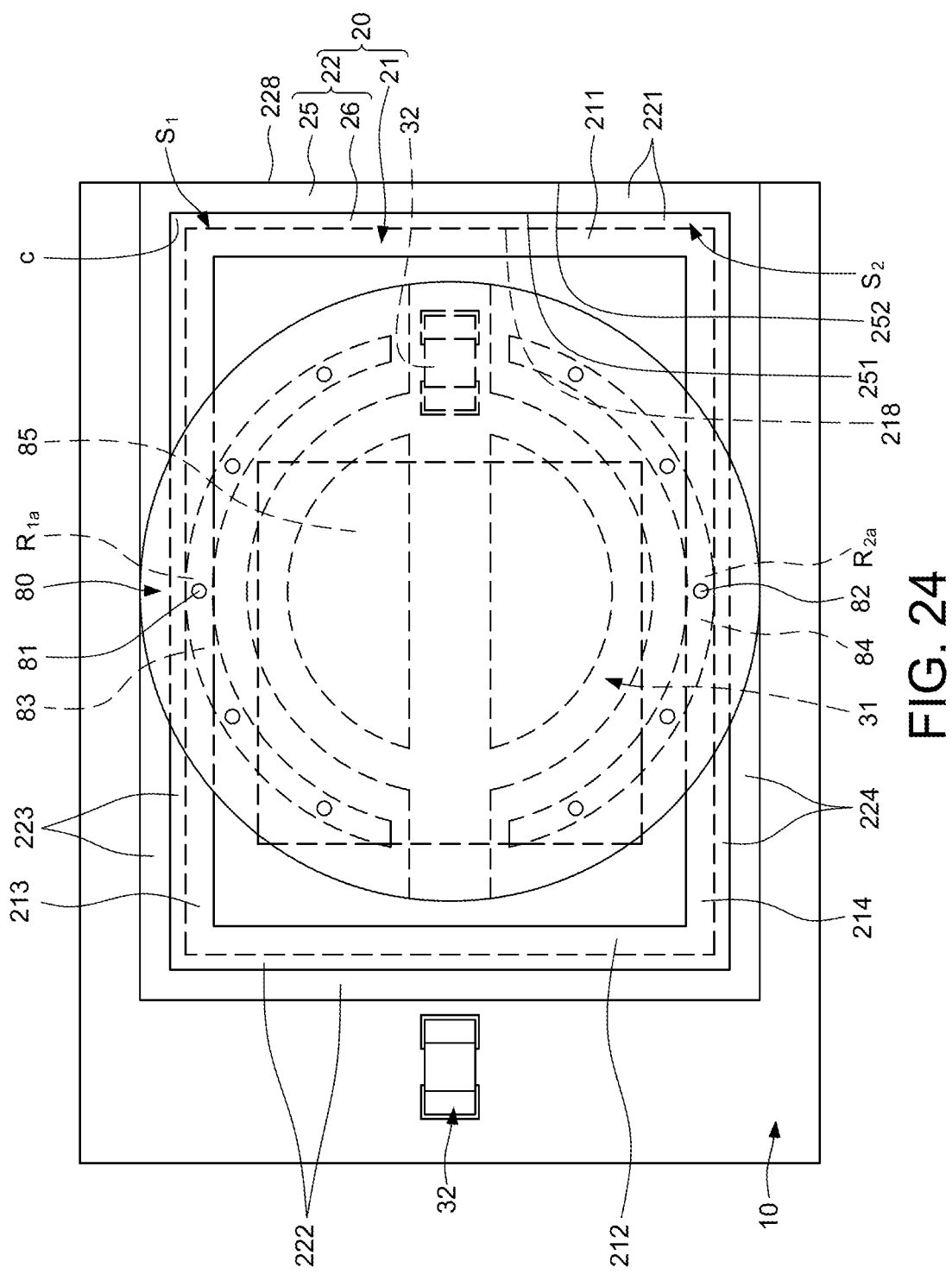
FIG. 24 illustrates one or more stages of an example of a method for manufacturing an electronic device according to some embodiments of the present disclosure.

FIG. 24 illustrates one or more stages of an example of a method for manufacturing an electronic device according to some embodiments of the present disclosure. The stage illustrated in FIG. 24 is the same as, or similar to, the stage illustrated in FIG. 17, except for a configuration of the first region $R_{1a}$ and the second region $R_{2a}$ of the shielding structure 20. In some embodiments, as shown in FIG. 24, the first region $R_{1a}$ of the shielding structure 20 may correspond to the third segment 213 of the first portion 21 (i.e., the first vertical portion or the supporting element). The second region $R_{2a}$ of the shielding structure 20 may correspond to the fourth segment 214 of the first portion 21 (i.e., the first vertical portion or the supporting element). Thus, the first vacuum hole 81 and the second vacuum hole 82 of the nozzle 80 may absorb the first region $R_{1a}$ and the second region $R_{2a}$ of the shielding structure 20, respectively.

Figure 25:
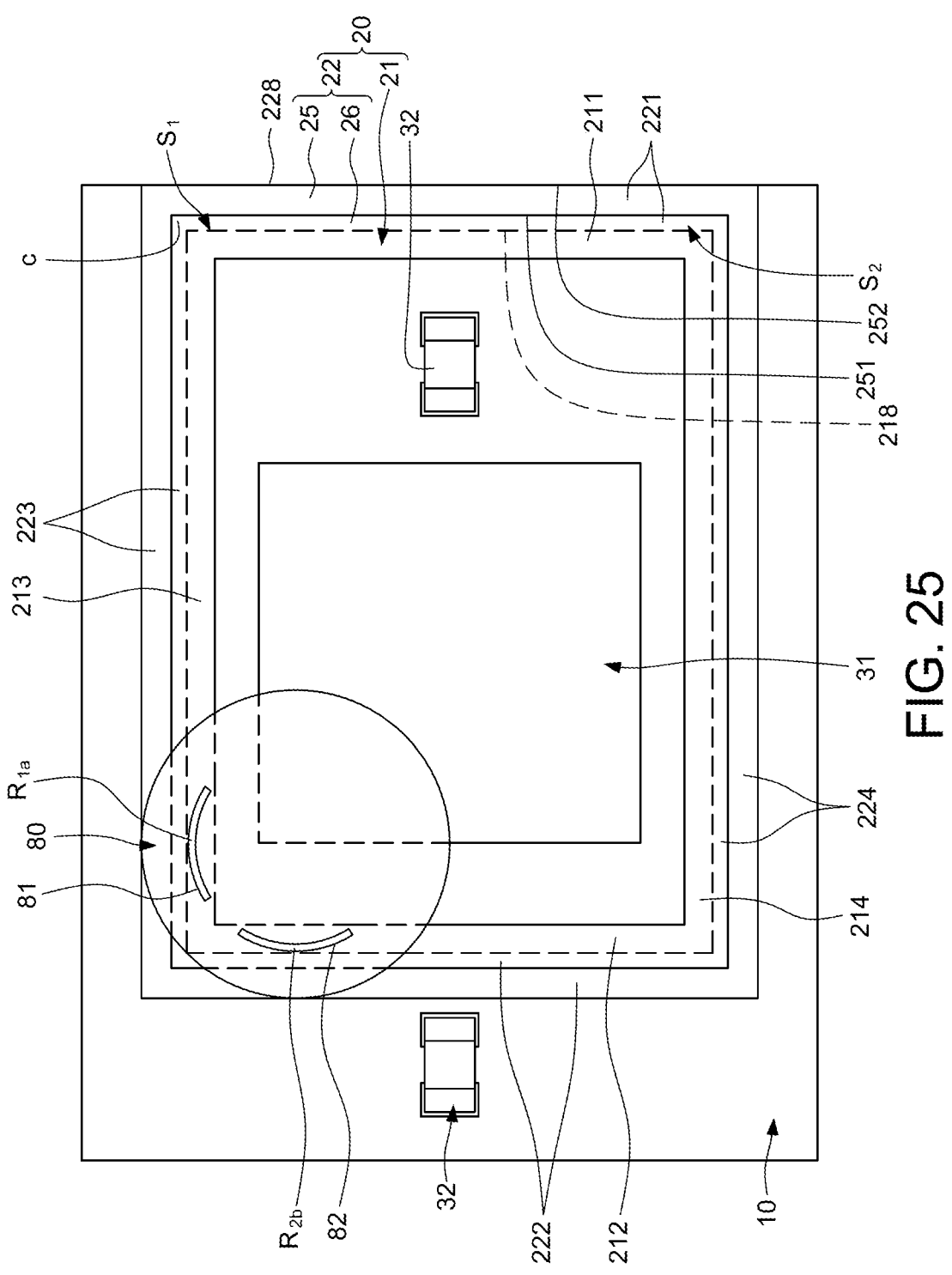
FIG. 25 illustrates one or more stages of an example of a method for manufacturing an electronic device according to some embodiments of the present disclosure.

FIG. 25 illustrates one or more stages of an example of a method for manufacturing an electronic device according to some embodiments of the present disclosure. The stage illustrated in FIG. 25 is the same as, or similar to, the stage illustrated in FIG. 24, except for a configuration of the second region $R_{2b}$ of the shielding structure 20. In some embodiments, as shown in FIG. 25, the second region $R_{2b}$ of the shielding structure 20 may correspond to the second segment 212 of the first portion 21 (i.e., the first vertical portion or the supporting element). Thus, the first vacuum hole 81 and the second vacuum hole 82 of the nozzle 80 may absorb the first region $R_{1a}$ and the second region $R_{2b}$ of the shielding structure 20, respectively. In some embodiments, a vertical projection of the first vacuum hole 81 is within the first region $R_{1a}$ and a vertical projection of the second vacuum hole 82 is within the second region $R_{2b}$.

Figure 26:
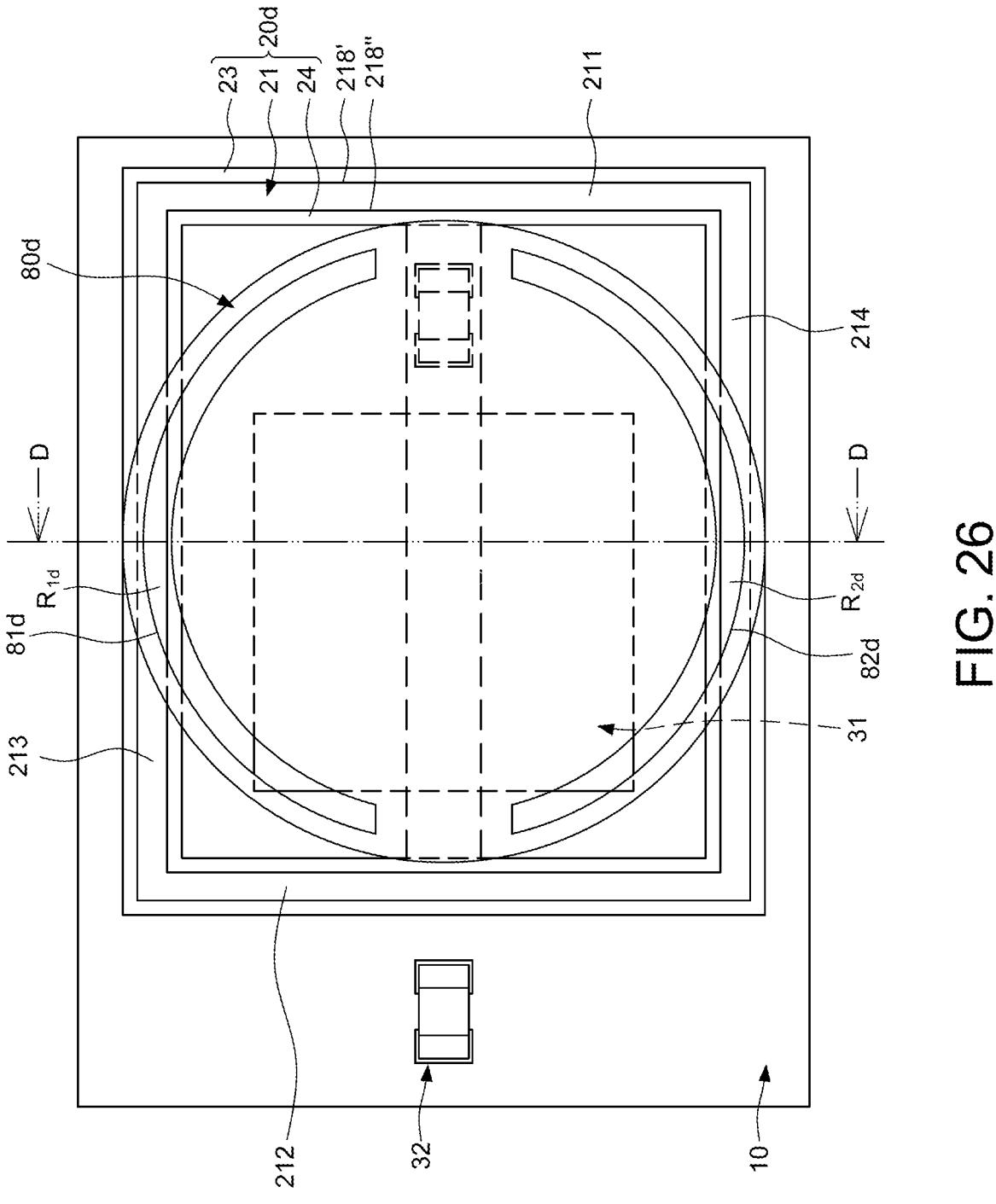
FIG. 26 illustrates one or more stages of an example of a method for manufacturing an electronic device according to some embodiments of the present disclosure.
Figure 27:
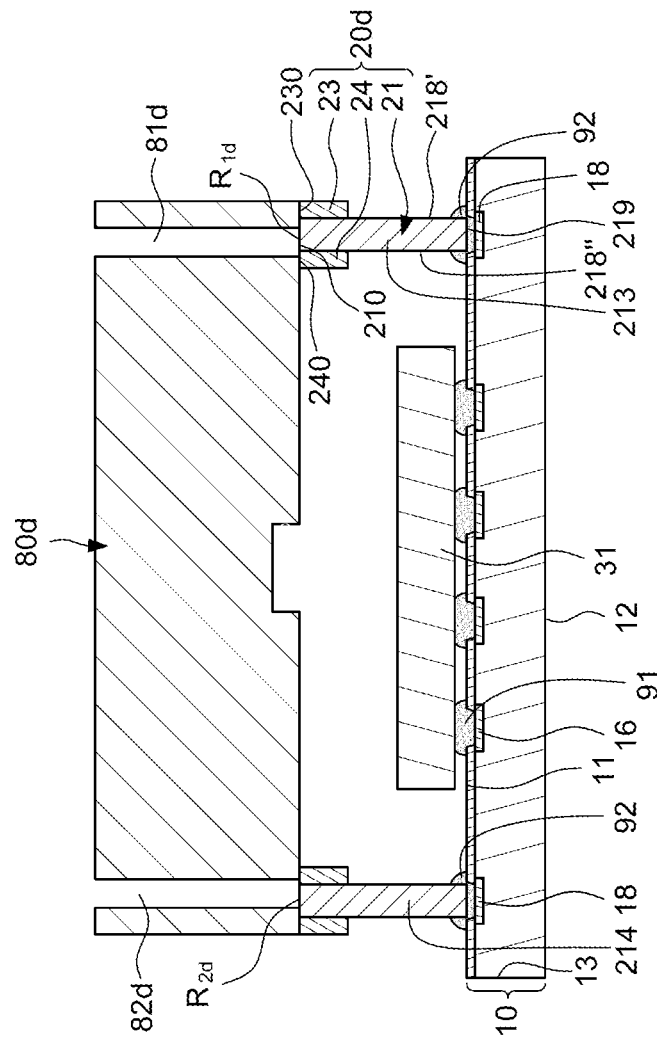
FIG. 27 illustrates one or more stages of an example of a method for manufacturing an electronic device according to some embodiments of the present disclosure.

FIG. 26 and FIG. 27 illustrate one or more stages of an example of a method for manufacturing an electronic device according to some embodiments of the present disclosure. The stage illustrated in FIG. 26 and FIG. 27 is the same as, or similar to, the stage illustrated in FIG. 18 and FIG. 24, except that the protruded portion 85 of the nozzle 80d is omitted and the shielding structure 20d may be the same as the shielding structure 20d of FIG. 8. In some embodiments, as shown in FIG. 26, a shape of the first vacuum hole 81d and the second vacuum hole 82d may be different from a shape of the first vacuum hole 81 and the second vacuum hole 82 of FIG. 24. In some embodiments, as shown in FIG. 26, the first vacuum hole 81d and the second vacuum hole 82d may be arc-shaped. In some embodiments, as shown in FIG. 26, the first vacuum hole 81d may be aligned with a first region $R_{1d}$ corresponding to the third segment 213 of the first portion 21 of the shielding structure 20d. The second vacuum hole 82d may be aligned with a second region $R_{2d}$ corresponding to the fourth segment 214 of the first portion 21 of the shielding structure 20d. In some embodiments, as shown in FIG. 27, the first region $R_{1d}$ of the shielding structure 20d may be absorbed or sucked by the first vacuum hole 81d of the nozzle 80d. The second region $R_{2d}$ of the shielding structure 20d may be absorbed or sucked by the second vacuum hole 82d of the nozzle 80d.

Figure 28:
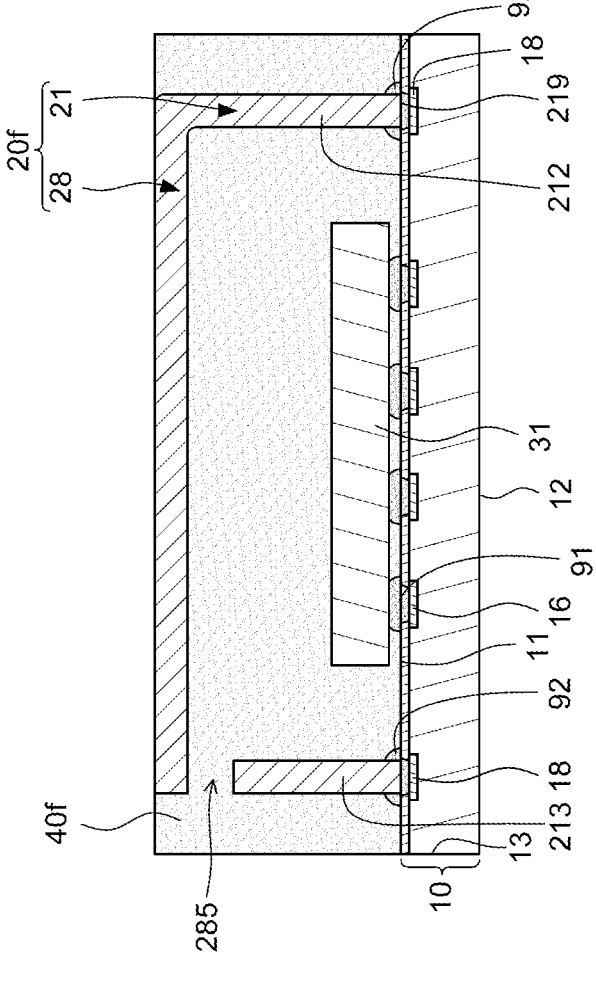
FIG. 28 illustrates one or more stages of an example of a method for manufacturing an electronic device according to some embodiments of the present disclosure.
Figure 29:
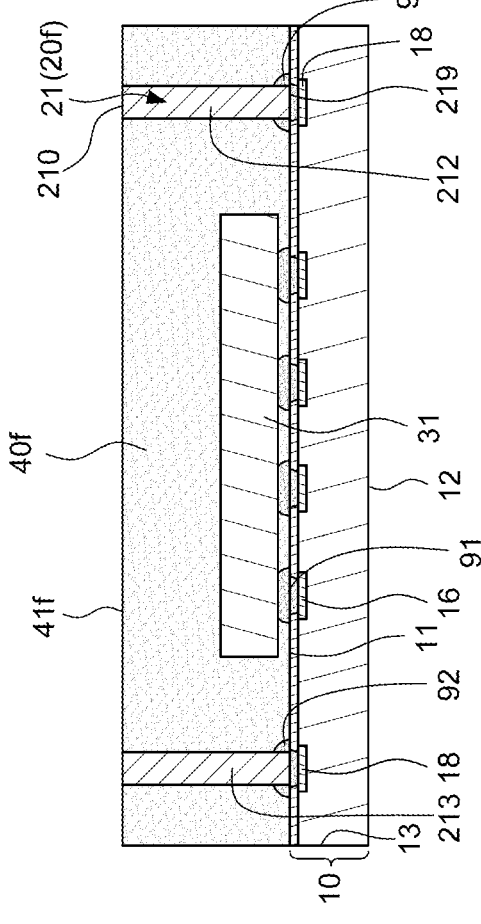
FIG. 29 illustrates one or more stages of an example of a method for manufacturing an electronic device according to some embodiments of the present disclosure.

FIG. 28 and FIG. 29 illustrate a method for manufacturing an electronic device according to some embodiments of the present disclosure. The initial stages of the illustrated process are the same as, or similar to, the stages illustrated in FIG. 15 through FIG. 19. FIG. 28 depicts a stage subsequent to that depicted in FIG. 19.

Referring to FIG. 28, an encapsulant 40f is formed on the circuit pattern structure 10 to encapsulate the least two electronic components (including, for example, the first electronic component 31 and the second electronic component 32 (FIG. 11)) and the shielding structure 20f (including, for example, the first portion 21 and the top cover 28). The shielding structure 20f of FIG. 28 may be the same as the shielding structure 20f of FIG. 11 and FIG. 12. The mold flow may enter the shielding structure 20f through the gap 285 and the plurality of recessions (including, for example, the first recession 281, the second recession 282, the third recession 283 and the fourth recession 284) (FIG. 11) to form the encapsulant 40f. In some embodiments, as shown in FIG. 28, the encapsulant 40f may expose a portion of the top cover 28 (e.g., a top surface).

Referring to FIG. 29, the top cover 28 and a portion of the encapsulant 40f are removed by, for example, grinding. In some embodiments, as shown in FIG. 29, a top surface 210 of the first portion 21 (i.e., the first vertical portion or the supporting element) may be exposed from a top surface 41f of the encapsulant 40f. In some embodiments, the top surface 210 of the first portion 21 (i.e., the first vertical portion or the supporting element) may be aligned with the top surface 41f of the encapsulant 40f.

Figure 30:
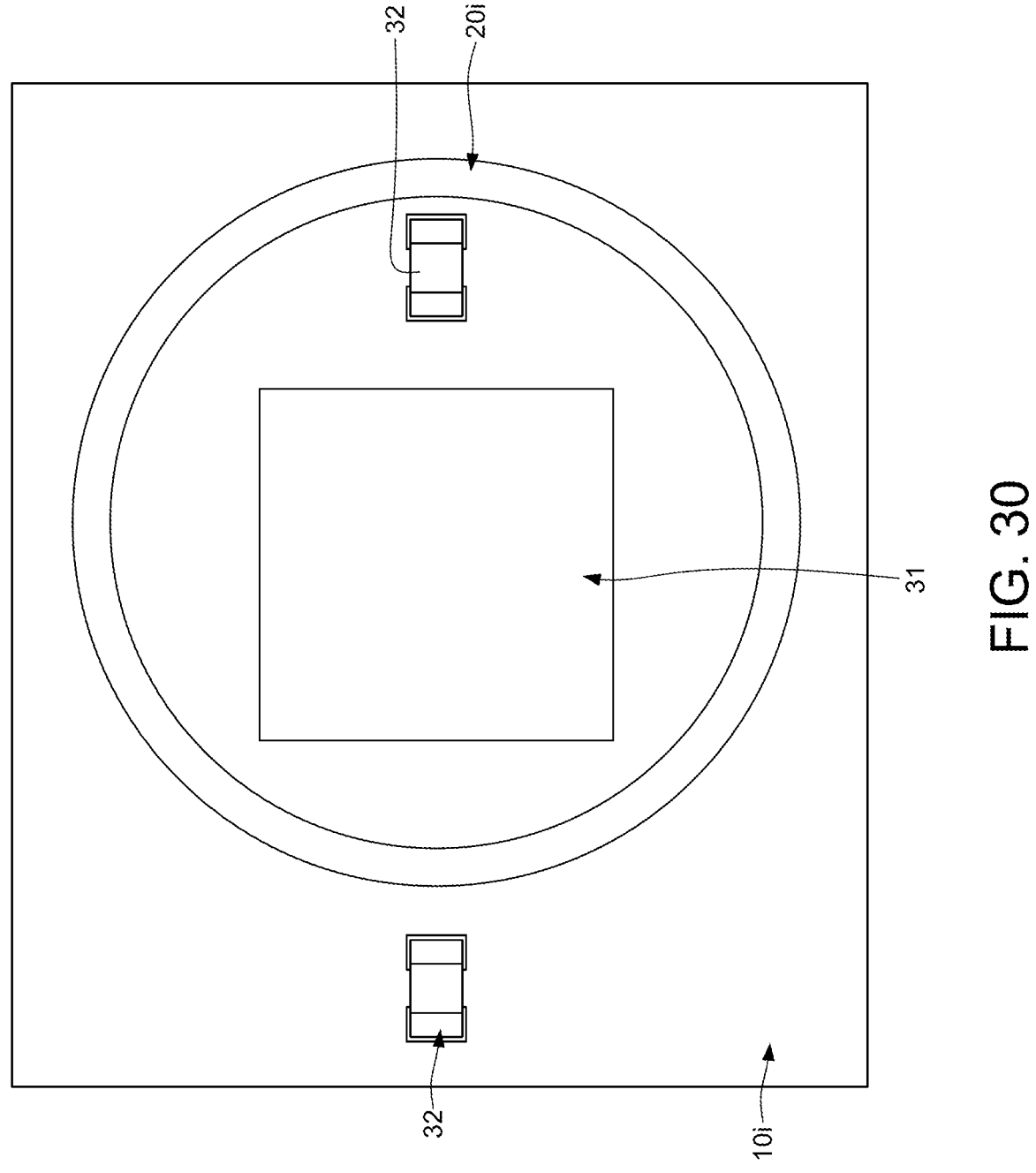
FIG. 30 illustrates a top view of an assembly of a shielding structure and a circuit pattern structure according to some embodiments of the present disclosure.

FIG. 30 illustrates a top view of an assembly of a shielding structure 20i and a circuit pattern structure 10i according to some embodiments of the present disclosure. The circuit pattern structure 10i of FIG. 30 may be the same as the circuit pattern structure 10 of FIG. 24. The shielding structure 20i of FIG. 30 is similar to the shielding structure 20 of FIG. 24, except for a shape of the shielding structure 20i. In some embodiments, as shown in FIG. 30, the shielding structure 20i may be circular shape.

Figure 31:
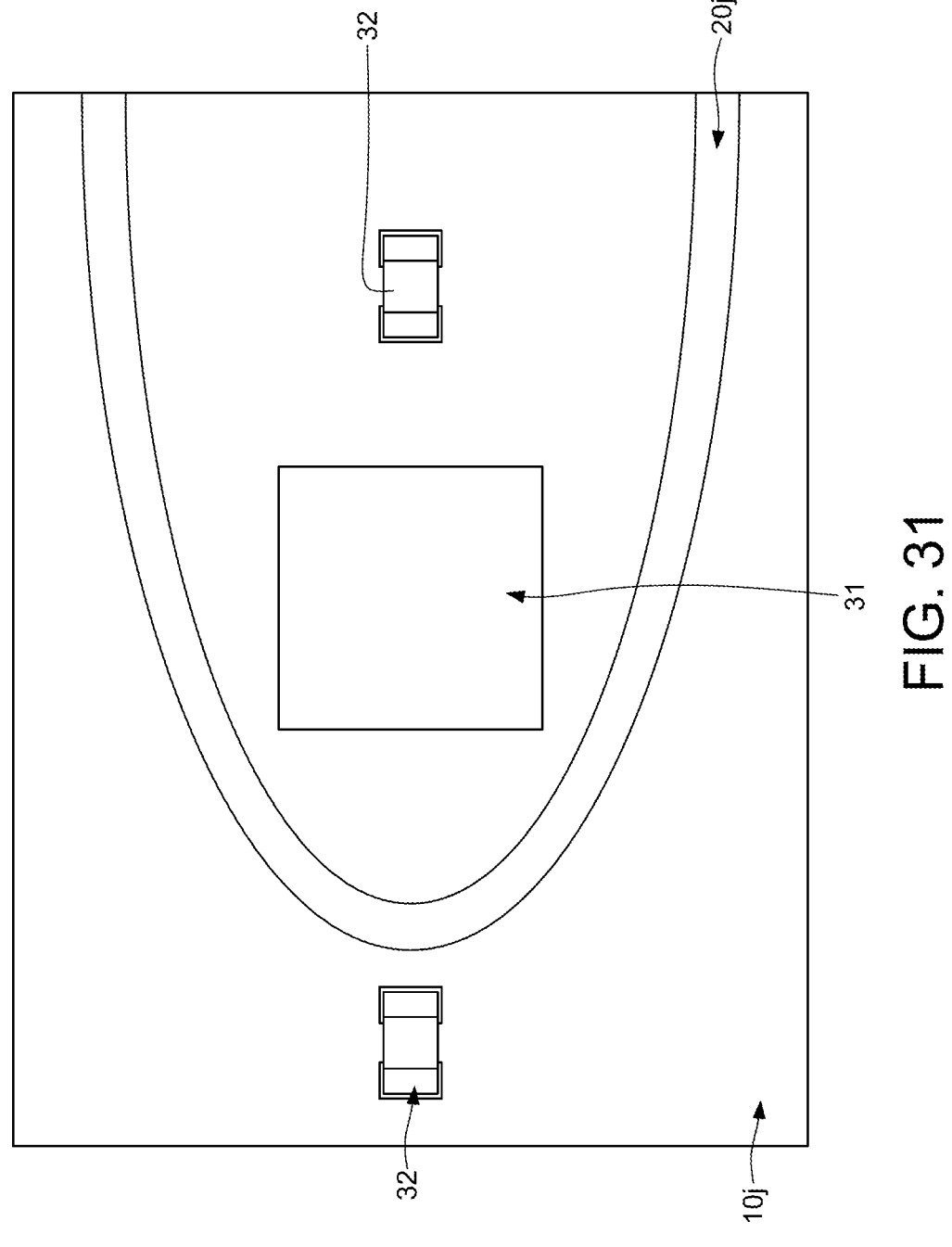
FIG. 31 illustrates a top view of an assembly of a shielding structure and a circuit pattern structure according to some embodiments of the present disclosure.

FIG. 31 illustrates a top view of an assembly of a shielding structure 20j and a circuit pattern structure 10j according to some embodiments of the present disclosure. The circuit pattern structure 10j of FIG. 31 may be the same as the circuit pattern structure 10i of FIG. 30. The shielding structure 20j of FIG. 31 is similar to the shielding structure 20i of FIG. 30, except for a shape of the shielding structure 20j. In some embodiments, as shown in FIG. 31, the shielding structure 20j may be U-shaped.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, a characteristic or quantity can be deemed to be "substantially" consistent if a maximum numerical value of the characteristic or quantity is within a range of variation of less than or equal to +10% of a minimum numerical value of the characteristic or quantity, such as less than or equal to +5%, less than or equal to +4%, less than or equal to +3%, less than or equal to +2%, less than or equal to +1%, less than or equal to +0.5%, less than or equal to +0.1%, or less than or equal to +0.05%.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:
at least two electronic components disposed over a circuit pattern structure; and
a shielding structure disposed between the at least two electronic components, and the shielding structure comprising a supporting element disposed between the at least two electronic components, an absorbable element supported by the supporting element and a connection element connected to the absorbable element;
wherein an elevation of a top surface of the connection element is higher than an elevation of a top surface of the absorbable element, wherein the connection element does not overlap with the supporting element, and wherein the connection element has a first lateral surface extending between the top surface of the connection element and the top surface of the absorbable element, and the first lateral surface is substantially parallel to a lateral side of the supporting element.

2. The electronic device of claim 1, wherein the connection element has a second lateral surface opposite to the first lateral surface and connected to a lateral side of a shielding layer, and the shielding layer is spaced apart from the absorbable element and the supporting element.

3. The electronic device of claim 1, wherein the top surface of the connection element is connected to an inner bottom side of a shielding layer, and the shielding layer is spaced apart from the absorbable element and the supporting element.

4. The electronic device of claim 2, wherein the shielding layer includes three metal layers stacked on one another.

5. The electronic device of claim 4, wherein the three metal layers includes a first stainless steel layer, a copper layer and a second stainless steel layer.

6. The electronic device of claim 1, further comprising an encapsulant encapsulating the shielding structure, wherein a lateral surface of the encapsulant exposes a portion of the connection element of the shielding structure.

7. The electronic device of claim 1, wherein the connection element and the absorbable element collectively define a first step, and the absorbable element and the supporting element collectively define a second step.

8. The electronic device of claim 7, wherein the first step faces upward, and the second step faces downward.

* * * * *